United States Patent
Kwon et al.

(10) Patent No.: US 12,315,710 B2
(45) Date of Patent: May 27, 2025

(54) PLASMA DIAGNOSIS SYSTEM AND PLASMA DIAGNOSIS METHOD

(71) Applicant: KWANGWOON UNIVERSITY INDUSTRY-ACADEMIC COLLABORATION FOUNDATION, Seoul (KR)

(72) Inventors: Gi Chung Kwon, Seongnam-si (KR); Bum Su On, Seoul (KR); Yeon Su Park, Seoul (KR)

(73) Assignee: KWANGWOON UNIVERSITY INDUSTRY-ACADEMIC COLLABORATION FOUNDATION, Seoul (KR)

(*) Notice: Subject to any disclaimer, the term of this patent is extended or adjusted under 35 U.S.C. 154(b) by 149 days.

(21) Appl. No.: 18/251,520

(22) PCT Filed: Nov. 3, 2020

(86) PCT No.: PCT/KR2020/015204
§ 371 (c)(1),
(2) Date: May 2, 2023

(87) PCT Pub. No.: WO2022/097760
PCT Pub. Date: May 12, 2022

(65) Prior Publication Data
US 2024/0021420 A1 Jan. 18, 2024

(51) Int. Cl.
*H01J 37/32* (2006.01)
(52) U.S. Cl.
CPC .......... *H01J 37/32917* (2013.01); *H01J 2237/24564* (2013.01)
(58) Field of Classification Search
CPC ............ G01R 33/00; G01R 33/0035; G01R 33/0023; G01R 33/0017; G01R 31/3191;
(Continued)

(56) References Cited

U.S. PATENT DOCUMENTS

2004/0007326 A1  1/2004  Roche et al.
2006/0249729 A1  11/2006  Mundt et al.
(Continued)

FOREIGN PATENT DOCUMENTS

KR  20070120027 A  12/2007
KR  20120118006 A  10/2012
KR  20200013885 A   2/2020

OTHER PUBLICATIONS

International Search Report for PCT/KR2020/015204 by Korean Intellectual Property Office dated Jul. 27, 2021.

*Primary Examiner* — Lee E Rodak
*Assistant Examiner* — Taqi R Nasir
(74) *Attorney, Agent, or Firm* — BROADVIEW IP LAW, PC

(57) ABSTRACT

A plasma diagnosis system includes a first planar substrate on which at least a part of plasma to be diagnosed generated in a plasma generation device is deposited; a second planar substrate disposed below the first planar substrate; a sensor unit which is disposed in a cavity formed in the first planar substrate to measure a plasma parameter of the generated plasma and is enclosed by an insulator to be electrically insulated from the first planar substrate; and an electronic device which is located between the first planar substrate and the second planar substrate, is shielded from the first planar substrate and the second planar substrate by means of ground plates, respectively, and measures and processes in real time a characteristic value of the plasma using an electric signal generated from the sensor unit by the plasma parameter.

13 Claims, 23 Drawing Sheets

(58) Field of Classification Search
CPC ......... G01B 7/004; G01C 17/38; G06F 3/017; G06F 3/0346; G06F 3/012; H01J 37/32917; H01J 2237/24564
See application file for complete search history.

(56) References Cited

U.S. PATENT DOCUMENTS

| | | | |
|---|---|---|---|
| 2008/0038926 A1* | 2/2008 | Ventzek | H01J 37/32082 156/345.35 |
| 2009/0058424 A1* | 3/2009 | Tatsumi | C23C 16/52 324/464 |
| 2018/0114681 A1* | 4/2018 | Jensen | H01J 37/32935 |

* cited by examiner

PLASMA DIAGNOSIS SYSTEM AND PLASMA DIAGNOSIS METHOD

CROSS-REFERENCE TO RELATED APPLICATIONS

This application is a National Phase Entry Application of PCT Application No. PCT/KR2020/015204 filed on Nov. 3, 2020, the entire content of which is hereby incorporated by reference in its entirety.

TECHNICAL FIELD

The present invention relates to a plasma diagnosis system and method, and more particularly, to a system and a method for diagnosing plasma using a difference in an electrical signal which changes before/after plasma discharge.

The present patent application has been filed as research projects as described below.
  Project Number: 00144296
  Department: Ministry of Trade, Industry, and Energy
  Project Name: Manufacturing Technology of 300 mm Wireless Wafer Type Process Sensor (SOW) for Diagnosis Real-time Semiconductor Heterogeneous Process Variables for PIM Semiconductor Process
  Contribution Ratio: 1/1
  Supervision Institution: ETRON Co., Ltd.
  Project Period: Apr. 1, 2022, to Dec. 31, 2025

BACKGROUND ART

In semiconductor device companies, the importance of integration and ultra-miniaturization processes is increasing in accordance with the development of device manufacturing technology, and the importance of internal state diagnosis and management systems of the processes by real-time and direct measurement method is increasing, so the needs of demand companies are increasing.

In a situation in which demands for etching and deposition equipment are rapidly increasing due to the increase in sales in the global semiconductor markets and the increase in new process technologies, a technique of diagnosing a process is an essential technology to preoccupy a future semiconductor equipment market by ensuring the reliability of the semiconductor process equipment.

Furthermore, the recent development speed of the manufacturing technique of semiconductor and display devices is faster than the development speed of the process equipment and the necessity of a process diagnosis technology which is capable of directly and precisely measure the process state in real time is growing and the recognition that it is not an option, but is a necessity is increasing.

In order to improve the degree of integration of semiconductor devices of 20 nm or smaller, the necessity of stricter process management is increasing to improve the process yield in major domestic sources of demand Specifically, intelligent equipment which manages and analyzes the process abnormality in real time by checking the process state for every location in the actual process and an advanced process diagnosis sensor which can control the process are required.

The indirect semiconductor process diagnosis sensor system utilizing the optics of the related art has limitations in measurement of positional difference and a measurement accuracy so that real-time and direct process diagnosis sensor system development is demanded within a range which does not affect the actual process.

In the related art, in order to measure characteristics of the plasma, a plasma frequency probe (Langmuir probe) in which a probe is directly perturbed in the plasma to measure a frequency is mainly used. According to this method, the probe is perturbed in the plasma while moving the probe in a vacuum chamber using a linear scanning method to measure a characteristic of the plasma for every position in the chamber.

However, according to this method, the interference between the probe and the plasma occurs so that a measured signal is distorted, which makes it difficult to diagnose the real-time state of the plasma. Further, according to the Langmuir probe method, a current formed in the probe by the plasma is measured by sweeping the DC voltage from a negative voltage of several tens of volts to a positive voltage of several tens of volts. During the process, when the by products are deposited on the probe, information (current) about the plasma through the probe may be blocked or distorted.

Further, according to the Langmuir probe method, it is manufactured by sweeping a broad range of DC voltage so that it is disadvantageous in that it is difficult to reduce the size.

Finally, according to the Langmuir probe method, the plasma is discharged using mixed gas during the actual process in many cases and in this case, it is difficult to diagnose a density of the plasma.

DISCLOSURE

Technical Problem

The present invention has been made an effort to improve the above-described related art and an object is to provide a plasma diagnosis system and method which monitor a plasma state in real time without causing distortion during the process to accurately determine a state of the plasma.

Technical Solution

According to an aspect of the present disclosure, in order to achieve the above-described objects, a plasma diagnosis system includes a first planar substrate on which at least a part of plasma to be diagnosed generated in a plasma generation device is deposited; a second planar substrate disposed below the first planar substrate; a sensor unit which is disposed in a cavity formed in the first planar substrate to measure a plasma parameter of the generated plasma and is enclosed by an insulator to be electrically insulated from the first planar substrate; and an electronic device which is located between the first planar substrate and the second planar substrate, is shielded from the first planar substrate and the second planar substrate by means of ground plates, respectively, and measures and processes in real time a characteristic value of the plasma using an electric signal generated from the sensor unit by the plasma parameter.

Further, according to another aspect of the present disclosure, in order to achieve the above-described objects, a plasma diagnosis method includes generating plasma to a plasma generation device to be diagnosed; exposing a plasma diagnosis system to the plasma to diagnose the plasma; measuring an electric signal generated from the plasma; and measuring a characteristic value of the plasma from the measured electric signal, the plasma diagnosing system includes a first planar substrate on which at least a part of plasma to be diagnosed generated in a plasma generation device is deposited; a second planar substrate disposed below the first planar substrate; a sensor unit which is disposed in a cavity formed in the first planar substrate to measure a plasma parameter of the generated plasma and is enclosed by an insulator to be electrically insulated from the first planar substrate; and an electronic device which is located between the first planar substrate and the second planar substrate, is shielded from the first planar substrate and the second planar substrate by means of ground plates, respectively, and measures and processes in real time a characteristic value of the plasma using an electric signal generated from the sensor unit by the plasma parameter.

Advantageous Effects

According to the above-described exemplary embodiment of the present invention, the plasma is diagnosed by measuring an impedance variation and a capacitance variation before and after plasma discharge during the plasma process to diagnose the plasma in real time, thereby enabling in-situ monitoring. By using this, it is possible to contribute to improve a process yield during the plasma process and improve the reliability of a process result. Therefore, the perturbation for plasma diagnosis is minimized as compared with the related art and even though the by products are deposited on the probe, the plasma characteristic (density and temperature) can be diagnosed to diagnose the plasma in real time.

Further, according to the exemplary embodiment of the present invention, a position of a sensor unit on which the plasma is deposited can be selected to perform calibration for every position on which the plasma is deposited.

Further, according to the exemplary embodiment of the present disclosure, a sensor unit which measures a plasma parameter may be configured in various forms.

Further, during the process using a plasma diagnosing system in real time, when the plasma discharging state is not normal, the device is compensated through the feedback so that a positive effect in semiconductor and display industries can be expected.

MODE FOR CARRYING OUT THE INVENTION

Figure 1A:
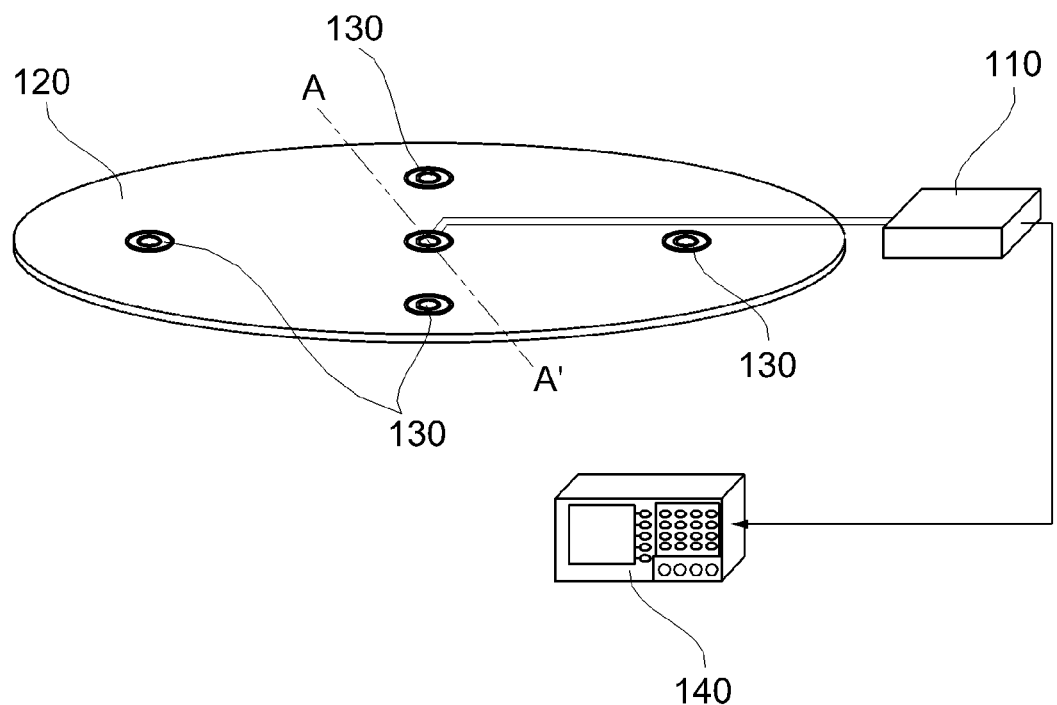
FIGS. 1A and 1B are conceptual views of a plasma diagnosis system according to an exemplary embodiment of the present invention.

In order to sufficiently understand the present invention, the operational advantages of the present invention, and the objectives achieved by the embodiments of the present invention, the accompanying drawings illustrating preferred embodiments of the present invention and the contents described therein need to be referred to.

Hereinafter, the present invention will be described in detail by explaining preferred embodiments of the present invention with reference to the accompanying drawings. However, the present invention can be realized in various different forms, and is not limited to the exemplary embodiments described herein. In order to clearly describe the present invention, a part which may obscure the present invention may be omitted and like reference numerals denote like components.

In the specification, unless explicitly described to the contrary, the word "comprise" and variations such as "comprises" or "comprising", will be understood to imply the inclusion of stated elements but not the exclusion of any other elements. In addition, the terms "unit", "-er" "-or", "module", and "block" described in the specification mean units for processing at least one function and operation and can be implemented by hardware components or software components and combinations thereof.

Figure 1B:
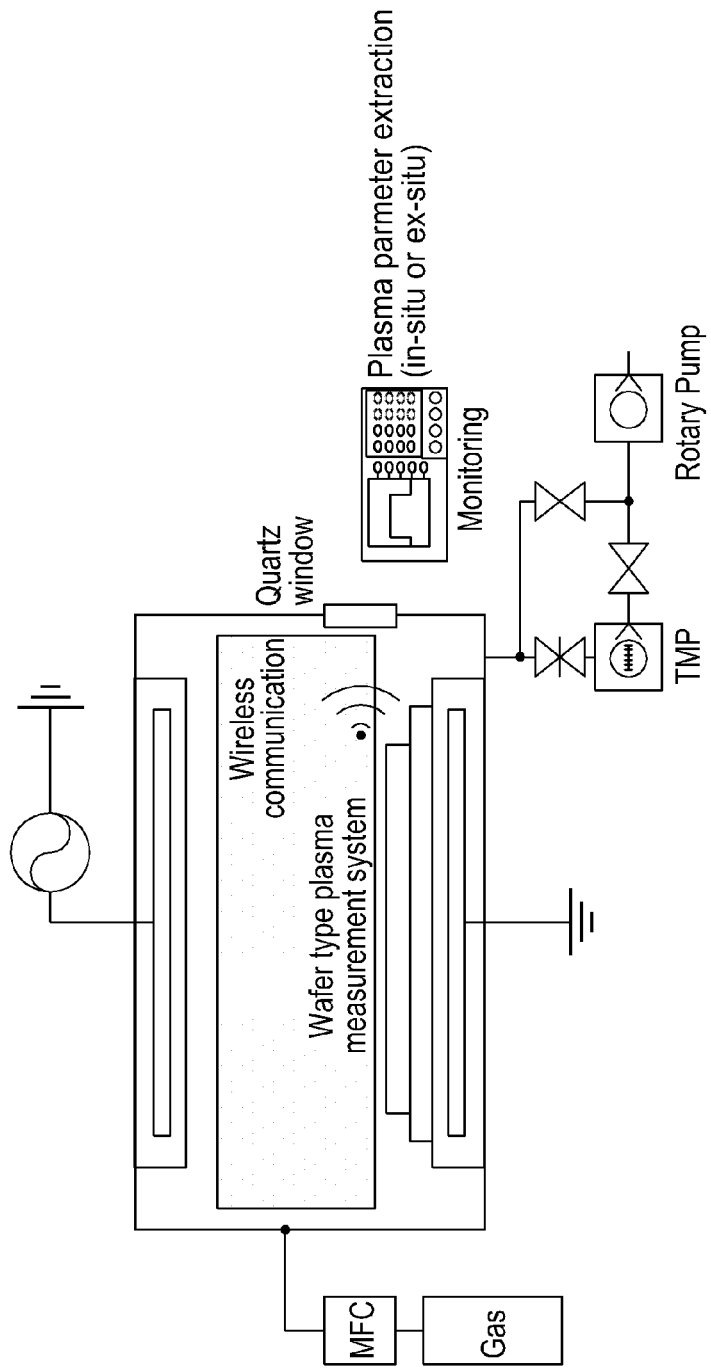

FIGS. 1A and 1B are conceptual views of a plasma diagnosis system according to an exemplary embodiment of the present invention.

In FIG. 1A, the reference numeral 100 denotes an electronic device for measuring a characteristic value of plasma according to the exemplary embodiment of the present invention, and the reference numeral 120 denotes a substrate on which when plasma generated by a plasma generator which is not illustrated is generated in a plasma chamber in which the plasma process is performed, the generated plasma is deposited. The reference numeral 130 is a sensor unit which is disposed in a cavity formed in the substrate to measure a parameter of the plasma. The reference numeral 140 is an observation device which converts a plasma characteristic value measured by the electronic device 110 into a digital signal to display the digital signal to a user. Even though in FIG. 1A, it is illustrated that the electronic device 110 is located at the outside of the substrate 120, it is illustrated for the convenience of description. Therefore, according to the exemplary embodiment of the present invention, the substrate 120 disclosed in FIG. 1A is configured by two substrates and the electronic device 110 is shielded between the substrates by a ground plate. Even though in FIG. 1A, the substrate is illustrated as a wafer, the present invention is not limited thereto.

In FIG. 1A, the line A-A' is a line illustrating a connection relationship between the sensor unit 130 formed on the substrate 120 and the electronic device 110 located between a first substrate and a second substrate which configure the substrate 120.

Referring to FIG. 1B, the plasma diagnosis system refers to a system which measures the plasma in real time by vacuum plasma process equipment. The plasma diagnosis system includes an electronic device 110 and the electronic device 110 performs the plasma diagnosis in real time from the outside of the process chamber using a wireless communication method.

Specifically, the wireless communication type plasma diagnosis system uses the electronic device 110 and a sensor in the silicon wafer as a micro electro mechanical system (MEMS) form to measure a plasma variable without being directly exposed to the plasma. Therefore, the plasma diagnosis system of the present invention has an advantage of minimizing the direct influence of the plasma in the process during the measurement and above all, the process diagnosis is possible in real time at the outside of the process chamber.

The electronic device 110 stores a plasma parameter in a memory to extract measurement data after the process to confirm the plasma measurement result.

Figure 2A:
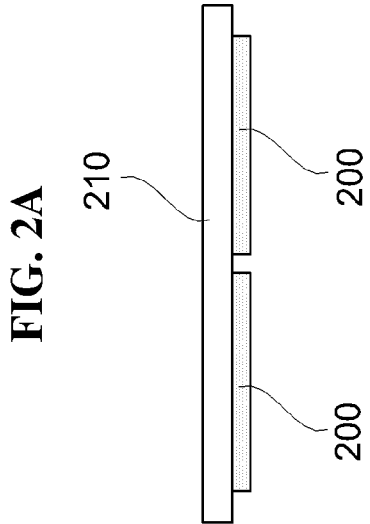
FIG. 2 illustrates one or more pairs of patterned electrodes implemented as a sensor unit which senses a plasma parameter according to an exemplary embodiment of the present invention.
Figure 2B:
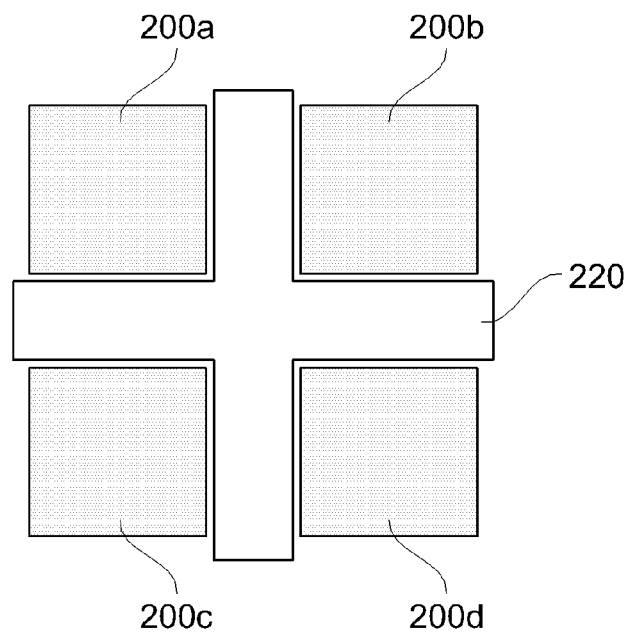
Figure 2B:
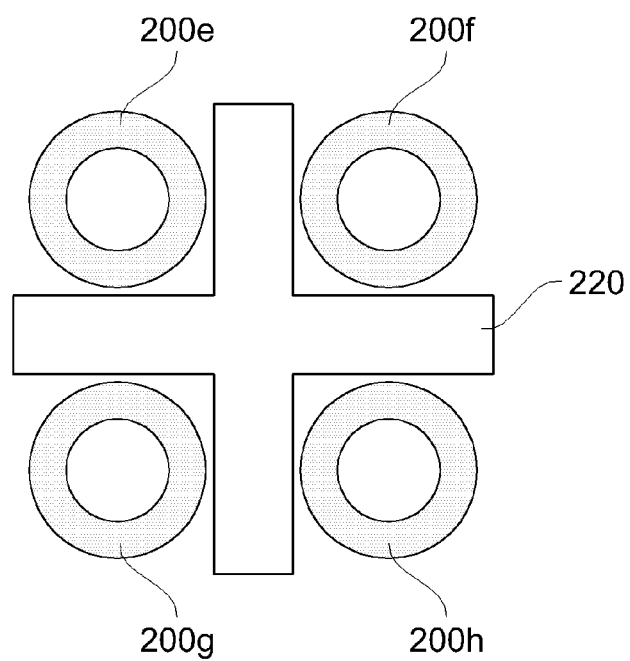

FIG. 2 illustrates one or more pairs of patterned electrodes implemented as a sensor unit which senses a plasma parameter according to an exemplary embodiment of the present invention. FIG. 2A shows that the electrode 200 is protected by an insulator or a dielectric 210 to prevent a tolerance to a high voltage and a leakage current. This is because when a high conductive material is used, the electronic device may be damaged by the plasma. The plasma parameter described in the present invention includes electrons, ions, an electron temperature, and an ion flux.

As illustrated in FIG. 2, according to the present invention, the sensor unit 130 is configured by one or more pairs of electrodes and the shape is as illustrated in FIG. 2B.

The electrode in FIG. 2B is configured by a total of two pairs (four) and may be implemented with a square shape as denoted by reference numerals 200a, 200b, 200c, and 200d or a donut shape as denoted by reference numerals 200e, 200f, 200g, and 200h. A common electrode is located between the electrodes.

Generally, as the structure changes to be a 3D pattern by several nm process, the importance of a high aspect ratio contact (HARC) process is increasing. Therefore, in order to put ions and radicals in a trench of the semiconductor structure, a higher bias voltage is applied. Such a high bias voltage causes interference with a plasma discharge frequency to reduce the power of an effective frequency to act as an element which hinders the plasma uniformity. The degradation of the plasma uniformity eventually results in reduction of a yield per process (cycle). Accordingly, a sensor unit 130 for intelligent equipment which manages and analyzes the process abnormality in real time by checking the process state for every location in the actual process and advanced process diagnosis which can control the process is necessary.

The sensor unit 130 according to the exemplary embodiment may be applied to a wafer type plasma measurement system for every position to minimize the plasma perturbation by the linear scanning method of the existing plasma diagnosis device (probe type) and minimize the perturbation in a plasma bulk.

Further, when a wireless system is used, the sensor unit 130 may minimize the perturbation by a cable used for connection with an external measurement system.

Further, the sensor unit 130 can measure the plasma characteristic (density and temperature) even though the by product is deposited on the probe and measure the plasma in real time for every position in the process chamber.

Further, the sensor unit 130 may simply calibrate the wafer type plasma system for every position using a wafer or a calibration tool and various types having one or more pairs of patterned electrodes may be applied.

The sensor unit 130 measures the plasma characteristic on the substrate using a specific frequency of a continuous wave or a pulse wave configured by a sine wave and a square wave in a range of 1 KHz to 1 MHz.

Figure 3A:
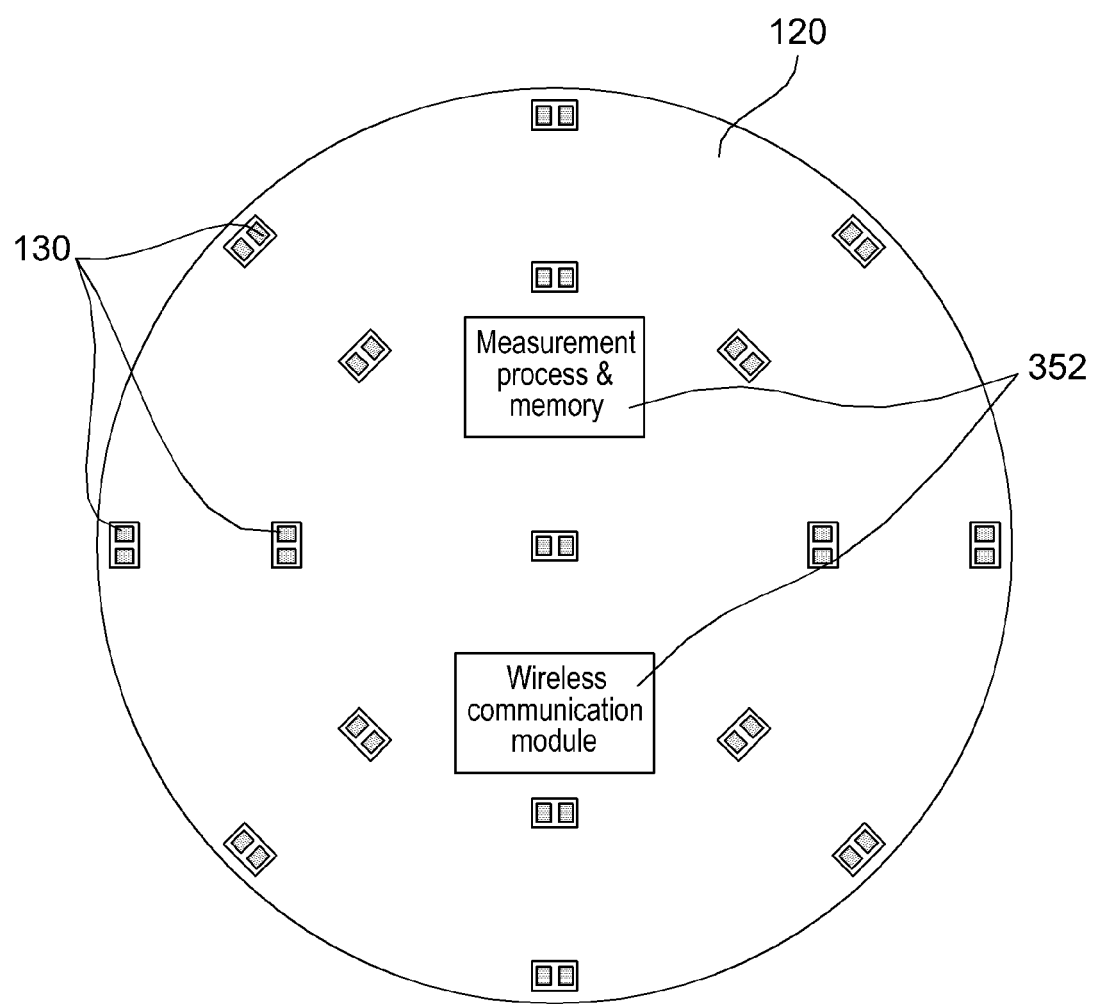
FIGS. 3A and 3B are views illustrating a configuration of a plasma diagnosis system according to an exemplary embodiment of the present invention.
Figure 3B:
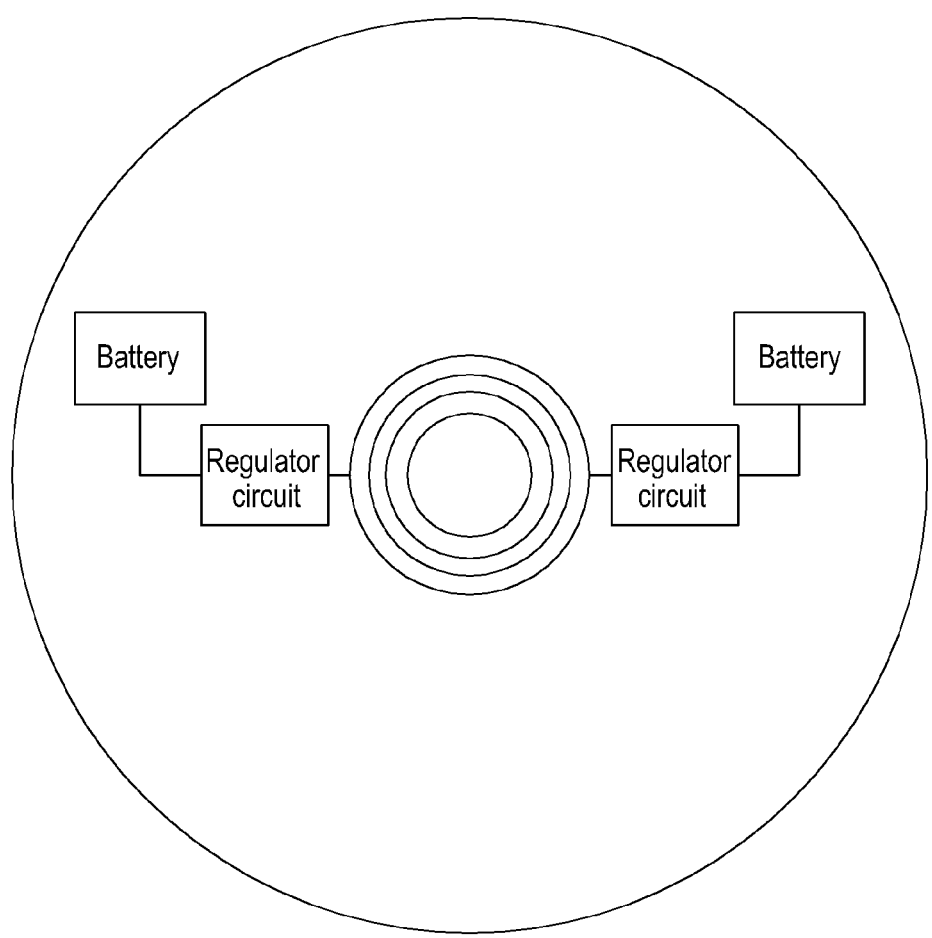

FIGS. 3A and 3B are views illustrating a configuration of a plasma diagnosis system according to an exemplary embodiment of the present invention. Here, FIG. 3A illustrates a first layer of a substrate 120 of a plasma diagnosis system and FIG. 3B illustrates a second layer of a substrate 120 of a plasma diagnosis system.

The plasma diagnosis system according to the exemplary embodiment diagnoses the plasma in real time during the plasma process in a vacuum environment.

The wafer type plasma measurement system includes a substrate 120 including a sensor unit 130 including a patterned electrode which reads a plasma parameter and diagnosis units 350 and 450 for processing the parameter and storing data. Here, the diagnosis units 350 and 450 include a measurement process module 352 including a measurement process and memory module and a wireless communication module for wireless communication. Further, the substrate 120 additionally includes an antenna for wireless charging, a regulator circuit, and a battery.

The patterned electrode for measuring a plasma parameter refers to one or more pairs of patterned electrodes. The patterned electrode uses a material having a high conductivity and in order to prevent the damage of the measurement process module 352 by the plasma, needs to be protected by a material which prevents the tolerance to the high voltage and the leakage current, on the patterned electrode.

The measurement process module 352 for processing a plasma parameter signal uses a method of measuring a plasma with an impedance variation value generated due to the plasma after generating a signal having a specific frequency and a method of measuring the plasma using a capacitance variation due to the plasma.

The substrate 120 of the wafer type plasma measurement system may be configured by plural layers. A basic configuration is configured by one pair of wafers bonded to each other and a cavity is formed in the wafer so as to place the circuit and the module therein. A cavity design process for forming a cavity aims to diagnose the process state so that the components are inserted without exposing them to the outside. During the cavity design process, after performing a front end of forming a cavity in a silicon substrate mold, a back end which is a process of fixing the components using an adhesive, similar to the semiconductor packaging, is performed. The front-end and the back-end prevent the line connection and shaking between components and improve the reliability of the signal.

FIGS. 3A and 3B illustrate layers which are arbitrary divided for description of a system configuration and the substrate 120 of the actual wafer type plasma measurement system may be formed with a structure different from that illustrated in the drawing.

FIG. 3A illustrates a first layer of a substrate 120 including a sensor unit 130 including a patterned electrode which reads a plasma parameter and diagnosis units 350 and 450 for processing the parameter and storing data. Here, the patterned electrode may be disposed in various forms to measure a uniformity of a plasma density in a process chamber and the uniformity according to the position may be mapped based on data by the electronic device 110. By doing this, the process state of a non-uniform part and a uniform part in the process may be diagnosed in real time.

FIG. 3B illustrates a second layer of a substrate 120 including a wireless charging module. Here, the wireless charging module is configured by an antenna, a regulator circuit, and a battery for wireless charging.

FIGS. 4A to 8 are cross-sectional views taken along the line A-A' and illustrate a configuration of a plasma diagnosis system according to an exemplary embodiment of the present invention.

Figure 4A:
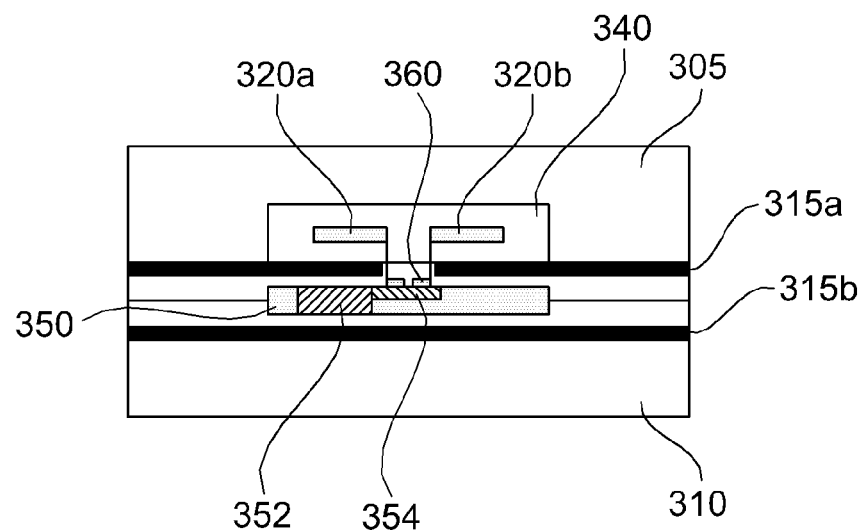
FIG. 4A is a view illustrating a configuration of a plasma diagnosis system according to an exemplary embodiment of the present invention.

FIG. 4A is a view illustrating a configuration of a plasma diagnosis system according to an exemplary embodiment of the present invention.

Referring to FIG. 4A, as described above with reference to FIG. 1A, the substrate 120 includes two substrates including a first planar substrate 305 and a second planar substrate 310, ground plates 315a and 315b, one pair of electrodes 320a and 320b corresponding to a sensor unit, a diagnosis unit 350, and a connection unit 360.

On the first planar substrate 305, at least a part of the plasma which is generated from a plasma generation device and is to be diagnosed is deposited and the second planar substrate 210 is disposed below the first planar substrate. The diagnosis unit 350 is located between the first planar substrate 305 and the second planar substrate 310 and is shield from the first planar substrate 305 and the second planar substrate 310 by means of the ground plates 315a and 315b and measures a characteristic value of the plasma using an electric signal generated in the pair of electrodes 320a and 320b which are the sensor units, by the plasma parameter. The connection unit denoted by the reference numeral 360 transmits an electric signal measured by one pair of electrodes 320a and 320b to the diagnosis unit 350. In the present invention, it is described that the diagnosis unit 350 and the connection unit 360 are included in an electronic device 900 to be described below.

In FIG. 4A, the sensor units 320a and 320b are enclosed by the insulator 340 to be electrically insulated from the first planar substrate 305 and is disposed in the cavity formed in the first planar substrate to measure the plasma parameter of the plasma. In FIG. 4A, the sensor units 320a and 320b are located in the cavity formed at a lower end of the first planar substrate 305.

As illustrated in FIG. 4A, the plasma diagnosis system according to the exemplary embodiment of the present invention is manufactured by vertically bonding the first planar substrate 305 and the second planar substrate 310. That is, the plasma diagnosis system according to the exemplary embodiment of the present invention is prepared by bonding the first planar substrate 305 and the second planar substrate 310 and inserting the electronic device 900 therebetween. At this time, the cavity formed in the first planar substrate 305 is formed using a micro electro mechanical system. The sensor units 320a and 320b are located in the cavity. One pair electrodes which are sensor units 320a and 320b according to the exemplary embodiment of the present invention are formed to have a predetermined pattern and the cavity is molded with an insulator which has a high breakdown voltage and blocks a leakage current. At this time, one pair of electrodes uses a material having a high conductivity. In FIG. 4A, in the electronic device 350, the cavity is formed at the lower end of the first planar substrate 305 and then the sensor units 320a and 320b are formed.

The first planar substrate and the second planar substrate according to the exemplary embodiment of the present invention use an insulator in which impurities are not mixed or a semiconductor having a high resistance. This is because when the doping semiconductor in which impurities are mixed is used, the doping semiconductor is likely to serve as a conductor in the event of plasma discharge. Further, the first planar substrate and the second planar substrate according to the exemplary embodiment of the present invention may be manufactured using glass. At this time, as the type of glass, quartz, high silica glass, or silica titania glass may be used.

In FIG. 4A, the ground plates 315a and 315b serve to protect internal electronic devices by means of external electromagnetic field shield using metal or a printed circuit board. Further, as an additional function, a shielding layer configured in the vicinity of the sensor is located on the lower end of the sensor units 320a and 320b to concentrate an electric field of the electrode in one direction which is an upper end of the electrode. Therefore, the range of the plasma measurement area above the wafer to be measured may be precisely controlled.

The insulator 340 uses a material which has a high breakdown voltage and blocks the leakage current to protect the electronic device.

The connection unit 360 transmits an electric signal received from one pair of electrodes 320a and 320b to the diagnosis unit 350. The connection unit 360 connects the electrodes and the diagnosis unit 350 in the form of an ohmic contact, such as a surface mount device contact (SMD) connector, a conductive paste, or low-temperature soldering (silver solder).

The diagnosis unit 350 performs an operation for parameter processing, data storing, and communication.

The diagnosis unit 350 includes a measurement process module 352 including a measurement process and memory module and a wireless communication module for wireless communication and a protection circuit unit 354.

The measurement process and memory module is configured by a sensor unit, a signal processing unit, and a micro-processor and the wireless communication module is configured by a communication unit, and all the modules are connected to a power unit which is a battery.

The measurement process module 352 is a part which processes the plasma parameter measured by the patterned electrode and converts the plasma parameter into a plasma density to measure the plasma parameter using at least two methods such as a plasma density measuring method using a plasma impedance variation and a plasma density measuring method using a capacitance variation.

Further, the measurement process module 352 may transmit the measured plasma parameter to the outside. The measurement process module 352 processes the plasma parameter measured at the outside of the process chamber to be checked in real time using the wireless communication module.

Further, the measurement process module 352 may store the measured plasma parameter in the memory. The measurement process module 352 extracts and processes data of the measured plasma parameter which is stored in the memory after the process.

The protection circuit unit 354 is configured by a high voltage limiting circuit and a regulated voltage holding circuit for protecting the measurement process module 352 from plasma generated in the plasma chamber and a high voltage and current flowing from an RF electrode.

Figure 4B:
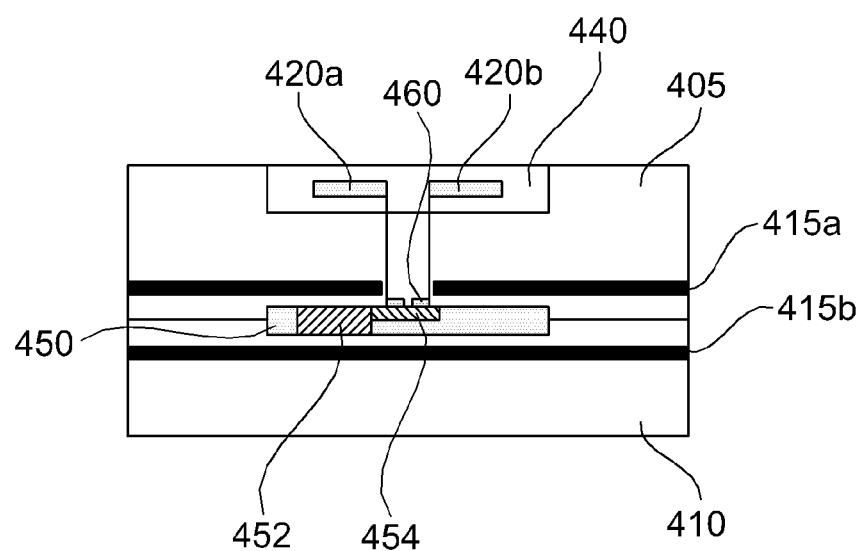
FIG. 4B is a view illustrating a configuration of a plasma diagnosis system according to another exemplary embodiment of the present invention.

FIG. 4B is a view illustrating a configuration of a plasma diagnosis system according to another exemplary embodiment of the present invention.

FIG. 4B is a view illustrating a configuration of a plasma diagnosis system according to another exemplary embodiment of the present invention. In FIG. 4B, the sensor units 420a and 420b are located in the cavity formed in the upper end of the first planar substrate 405, unlike FIG. 4A.

The second planar substrate 410, the ground plates 415a and 415b, the diagnosis unit 450, and the connection unit 460, which are configurations other than the first planar substrate 405 illustrated in FIG. 4B are the same as description of FIG. 3 so that the description thereof will be omitted.

As described in FIGS. 4A and 4B, when the sensor units 320a, 320b, 420a, and 420b are formed on the first planar substrate, in order to prevent the damage on the electronic devices 350 and 450 by the external electromagnetic wave and signal distortion by an external frequency in the event of the plasma parameter analysis, a method of coating a metal layer is used or a conductive material which blocks the external electromagnetic wave, such as a printed circuit board may be covered thereon. Thereafter, the insulator is covered on the conductive material. The insulator used at this time may be configured by the same material as the insulators 340 and 440 which mold the sensor units 320a, 320b, 420a, and 420b. The insulator needs to be formed to prepare a space for mounting the electronic devices 350 and 450.

The diagnosis unit 450 performs an operation for parameter processing, data storing, and communication.

The diagnosis unit 450 includes a measurement module 452 including a measurement process and memory module and a wireless communication module for wireless communication and a protection circuit unit 454.

The measurement process module 452 is a part which processes the plasma parameter measured by the patterned electrode and converts the plasma parameter into a plasma density to measure the plasma parameter using at least two methods such as a plasma density measuring method using a plasma impedance variation and a plasma density measuring method using a capacitance variation.

Further, the measurement process module 452 may transmit the measured plasma parameter to the outside. The measurement process module 452 processes the plasma parameter measured at the outside of the process chamber to be checked in real time using the wireless communication module. As the method of the wireless communication module, Wi-Fi communication, Bluetooth communication, and infrared communication are used. Here, the method of the wireless communication module is desirably a Bluetooth wireless communication method which uses a low power to operate a module inserted into the wafer and the Bluetooth wireless communication method has an advantage in that the measurement is available for a longer time during the process.

Further, the measurement process module 452 may store the measured plasma parameter in the memory. The measurement process module 452 extracts and processes data of the measured plasma parameter which is stored in the memory after the process.

The measurement process module 452 controls and learns process variables, such as a pressure, an RF power, a flow rate, and a temperature to meet the process requirements, such as a plasma density, temperature, and a high uniformity of the plasma, required for the semiconductor and display process, based on the processed data and optimizes and shortens a process cycle time by controlling and learning the process variables.

The protection circuit unit 454 is configured by a high voltage limiting circuit and a regulated voltage holding circuit for protecting the measurement process module 452 from plasma generated in the plasma chamber and a high voltage and current flowing from an RF electrode.

Figure 5:
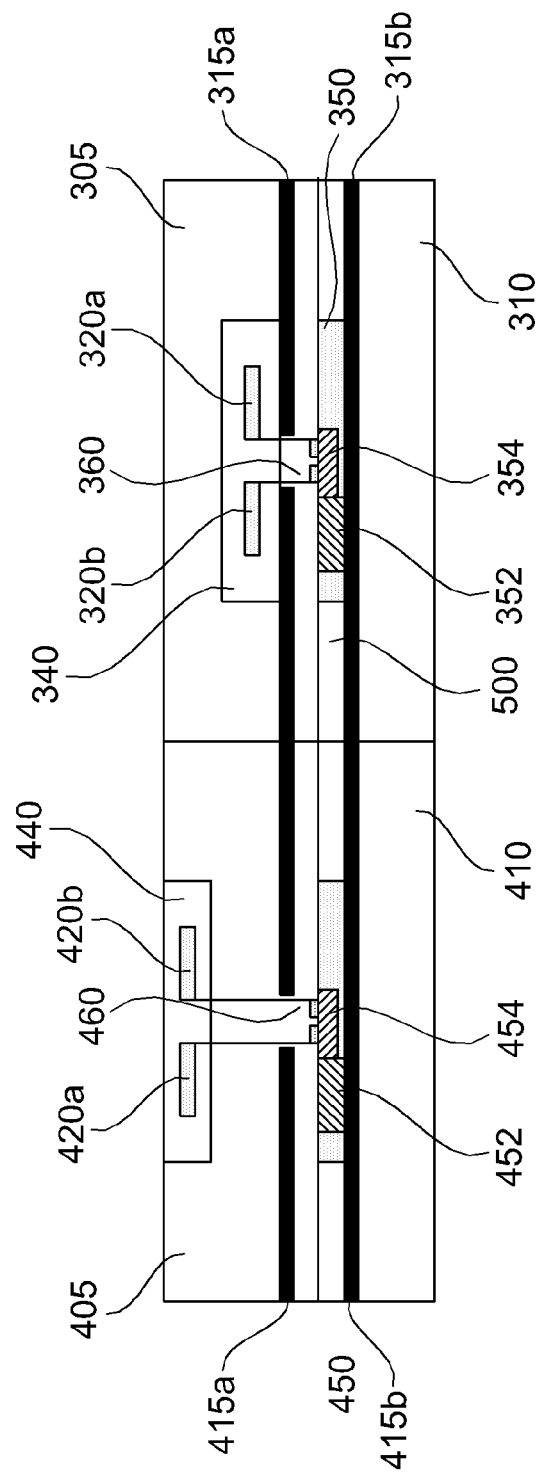
FIG. 5 is a view illustrating a configuration of a plasma diagnosis system according to another exemplary embodiment.

FIG. 5 is a view illustrating a configuration of a plasma diagnosis system according to another exemplary embodiment. FIG. 5 is a view that the diagnosis unit 350 illustrated in FIG. 4A and the diagnosis unit 450 illustrated in FIG. 4B are configured using a thin circuit board, such as a flexible printed circuit board (F-PCB) 500 and when the diagnosis unit is configured as illustrated in FIG. 5, a volume of a circuit which configures the plasma diagnosis system may be reduced.

Figure 6:
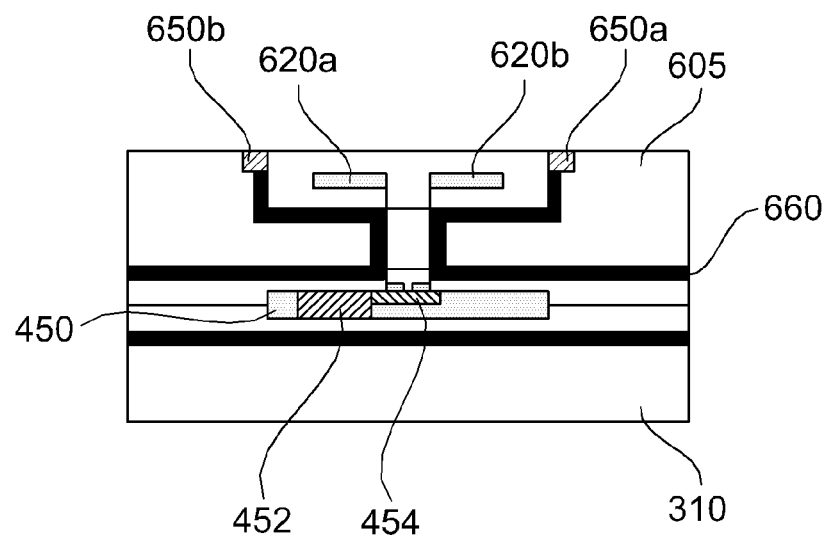
FIG. 6 is a view illustrating a configuration of a plasma diagnosis system according to still another exemplary embodiment.

FIG. 6 is a view illustrating a configuration of a plasma diagnosis system according to still another exemplary embodiment. In FIG. 6, like the configuration of the plasma diagnosis system described with reference to FIG. 4B, a sensor unit including one pair of electrodes 620a and 620b is located above the first planar substrate 605, and second insulators 650a and 650b are disposed on both sides of the sensor unit. In FIG. 6, the ground plate 660 of the first plate substrate 605 extends to second insulators 650a and 650b located on a side surface of the sensor unit, which is different from that illustrated in FIG. 4B. Hereinafter, second insulators 650a, 650b, 750a, 750b, 750c, 750d, 850a, and 850b disclosed in FIGS. 6 to 8 block external power or external electric signals using a material having a low permittivity to prevent the damage of the circuit due to the electric signal input from the outside or reduce a crosstalk which may be caused in the measurement of the plasma parameter.

Figure 7:
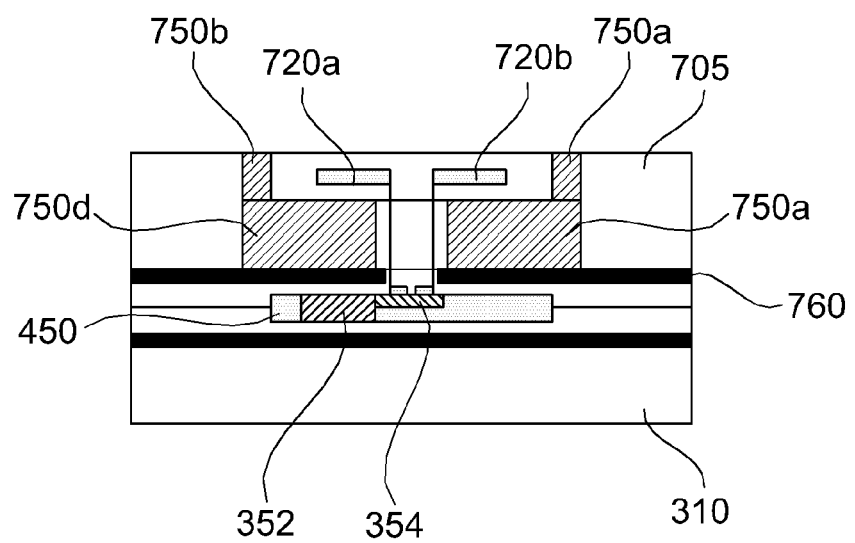
FIG. 7 is a view illustrating a configuration of a plasma diagnosis system according to still another exemplary embodiment.

FIG. 7 is a view illustrating a configuration of a plasma diagnosis system according to still another exemplary embodiment.

In FIG. 7, like the configuration of the plasma diagnosis system described with reference to FIG. 4B, a sensor unit including one pair of electrodes 720a and 720b is located above the first planar substrate 705, and insulators 750c and 750d are disposed between both sides 750a and 750b of the sensor unit and the sensor unit and the ground plate 760.

Figure 8:
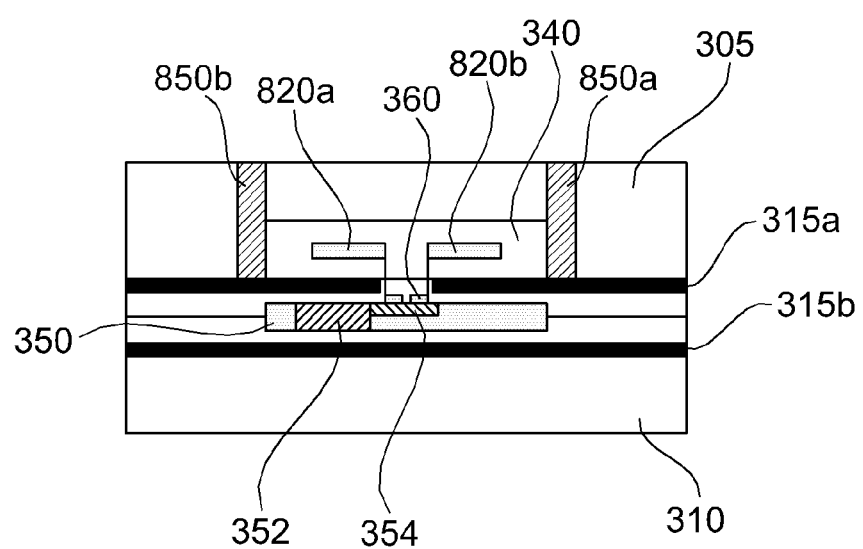
FIG. 8 is a view for explaining an implementation example of a sensor unit described in FIG. 1 according to another exemplary embodiment.

FIG. 8 is a view for explaining an implementation example of a sensor unit described in FIG. 1 according to another exemplary embodiment. In FIG. 8, as compared with FIG. 4A described above, insulators 850a and 850b are additionally located on a side surface of an insulator which encloses electrodes 820a and 820b and extend to an upper surface of the first planar substrate 305 from the ground plate 315a.

The diagnosis unit which has been described above in FIGS. 4A to 8 uses a method of diagnosing the plasma with an impedance variation value generated before/after plasma discharge after generating a signal having a specific frequency and a method of diagnosing the plasma using a capacitance variation before/after plasma discharge.

Hereinafter, a block configuration of an electronic device 900 for diagnosing a plasma state according to an exemplary embodiment of the present invention will be described with reference to FIG. 9.

Figure 9:
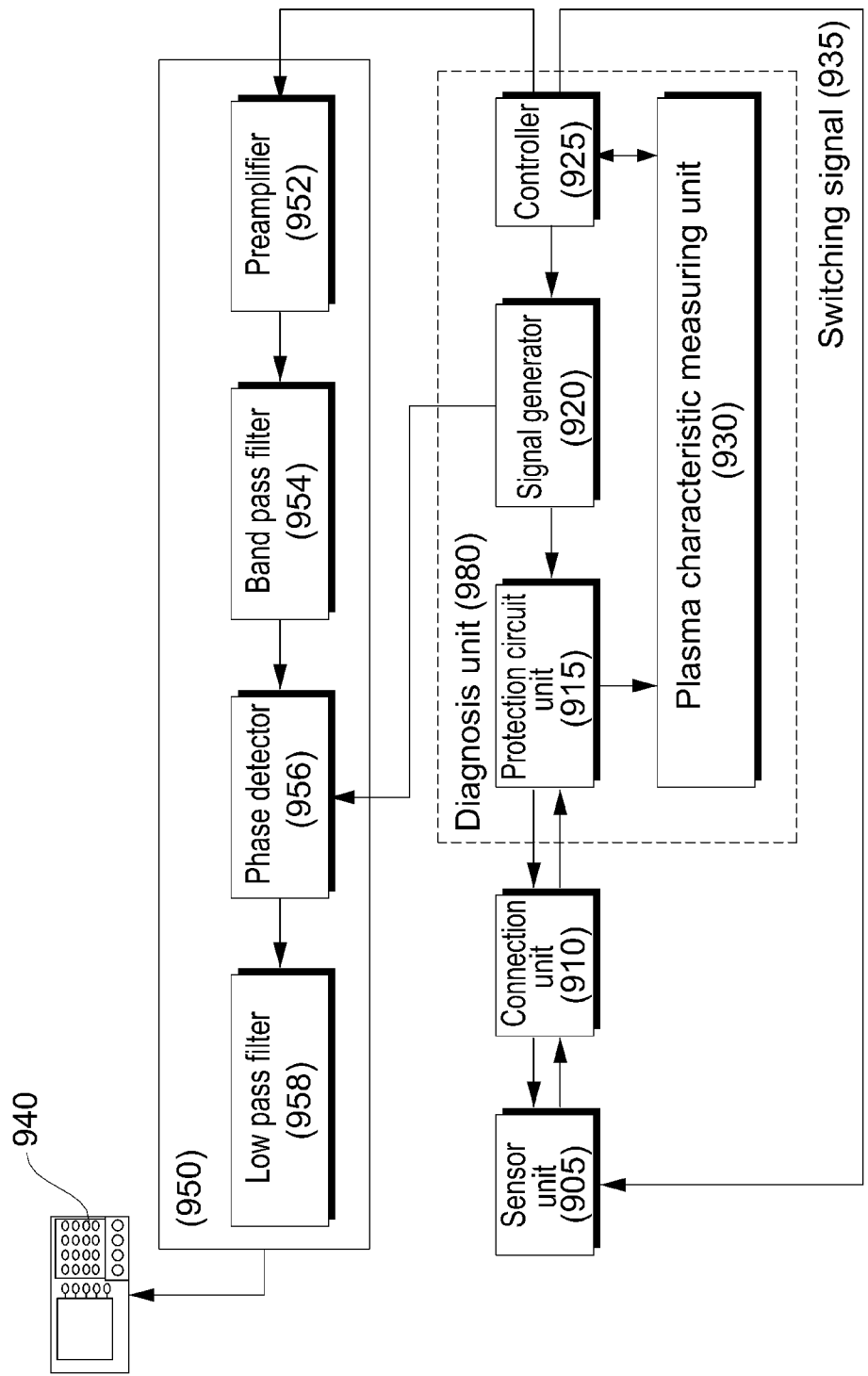
FIG. 9 is a block diagram of an electronic device for diagnosing a plasma state according to an exemplary embodiment of the present invention.

FIG. 9 is a block diagram of an electronic device 900 for diagnosing a plasma state according to an exemplary embodiment of the present invention.

As illustrated in FIG. 9, the electronic device 900 according to the exemplary embodiment of the present invention includes a connection unit 910, a protection circuit unit 915, a signal generator 920, a controller 925, a plasma characteristic measuring unit 930, and a noise canceller 950.

The connection unit 910 is connected to the sensor unit 905 to transmit an electric signal generated in the sensor unit to the electronic device 900. Here, the generated electric signal may be a voltage caused by the change in the impedance measured before/after the plasma discharge in the plasma chamber and the change in the capacitance measured before/after the plasma charge in the plasma chamber.

When a magnitude of the electric signal received through the connection unit 910 is larger than a predetermined reference, the protection circuit unit 915 limits the magnitude of the electric signal. That is, the protection circuit unit 915 is configured by a high voltage limiting circuit and a regulated voltage holding circuit for protecting the electronic device 900 from plasma generated in the plasma chamber and a high voltage and current flowing from an RF electrode. The high voltage limiting circuit limits the magnitude of the electric signal. The regulated voltage holding circuit constantly maintains a magnitude of the limited signal.

For example, the protection circuit unit 915 may use a diode, a Zener diode, and a ground to limit the magnitude of the electric signal. The protection circuit unit 915 prevents a high output of electric energy from the plasma generator which can be used during the plasma discharge from flowing into the circuit in the electronic device 900 through the electrode to protect the circuit in the electronic device 900.

The signal generator 920 generates a signal having a frequency in a range which does not at least partially overlap a discharging frequency of plasma generated in a plasma generator to be diagnosed. The plasma generator is a device to be diagnosed and corresponds to an external component of the plasma diagnosing system of the present invention. Here, when the range does not at least partially overlap the discharging frequency of the plasma, it means that a center frequency is different or a frequency band is different. A discharge frequency of the plasma generation device may be 5 to 20 MHz. A frequency of an electric signal generated in the signal generating unit 920 may be used in a range of 1 KHz to 1 MHz so as not to overlap the plasma discharging frequency. A signal generated in the signal generator 120 becomes a reference for measuring capacitance and various types of waveform may be applicable.

The plasma characteristic measuring unit 930 measures a characteristic value of the plasma using an electric signal transmitted from the protection circuit unit 915. At this time, the plasma characteristic measuring unit 930 measures the characteristic of the plasma by measuring the change in the impedance or the change in the capacitance corresponding to the plasma parameter sensed by the sensor unit 905 before/after discharging the plasma generated in the plasma chamber. At this time, the measured characteristic of the plasma may be a plasma density.

The controller 925 converts the plasma parameter into a plasma density using the measured change in the impedance or change in the capacitance, and then transmits the converted value to the noise canceller 950. Specifically, the controller 925 according to the exemplary embodiment of the present invention generates a signal indicating the plasma characteristic according to the impedance variation or the capacitance measured by the sensor unit 905 to output the signal to an observation unit 940 through the noise canceller 950. The user confirms the digitalized plasma state value by means of the observation unit 940 and diagnoses the plasma state thereby. Further, the controller 925 transmits a switching signal 935 for selecting electrodes used to measure the plasma parameter, among the plurality of electrodes 200a, 200b, 200c, 200d, 200e, 200f, 200g, 200h included in the sensor unit 905 to the sensor unit 905.

The noise canceller 950 includes a preamplifier 952, a band pass filter 954, a phase detector 956, and a low pass filter 958. The noise canceller 950 filters the electric signal transmitted from the controller 925.

The preamplifier 952 amplifies a signal transmitted from the controller 925 to constantly maintain the signal and installs a filter circuit at an input terminal which receives a signal from the controller 925 to prevent the damage of the preamplifier 952 due to the signal transmitted from the controller 925. The filter circuit may include a low pass filter, a high pass filter, a band pass filter, and a band stop filter. The band pass filter 954 passes a frequency of the amplified electric signal in a range at least partially overlapping a frequency of the generated plasma. The phase detector 956 may remove the noise using a phase difference between the electric signal which passes the band pass filter 954 and the reference waveform generated in the signal generator 920. The low pass filter 958 may pass a low frequency component of the electric signal which passes the phase detector 956.

The observation unit 940 is a device which displays the filtered electric signal on a screen and corresponds to an external component of the electronic device 900 of the plasma diagnosis device 900 of the present invention. The user observes the plasma characteristic (for example, the plasma density) by observing the voltage and the capacitance of the plasma in real time, using the observation unit 940.

Hereinafter, two methods for measuring the plasma characteristic by the plasma characteristic measuring unit 930 in the electronic device 900 of FIG. 9 will be described.

The plasma measuring unit 930 measures and analyzes plasma major factors, such as a plasma density, an ion flux, or an electron temperature using the plasma parameter measured by the sensor unit 905. The controller 925 outputs a plasma state diagnosis signal through the plasma characteristic measured by the plasma characteristic measuring unit 930.

The method for measuring the plasma by the plasma characteristic measuring unit 930 according to the exemplary embodiment of the present invention is divided into two methods as follows.

A first method is a method of diagnosing a plasma state using an impedance variation measured by the sensor unit 905.

According to the method of diagnosing the plasma state using the impedance variation, the impedance value formed with a reference waveform in the unit of kHz changes depending on the presence of plasma and the plasma characteristic measuring unit 930 measures the change in the voltage by means of the change in the impedance value. The plasma characteristic measuring unit 930 measures the plasma characteristic by means of the change in the voltage, which will be described with reference to Equations 1 to 6 to be described below. Equations 1 to 6 are equations for calculating a density of the plasma using the impedance variation.

A second method is a method of diagnosing a plasma state using an capacitance variation measured by the sensor unit 905.

The capacitance changes according to a width of the electrode included in the sensor unit 905, a length of the electrode, an interval between electrodes, a type and a thickness of an insulator. The capacitance generated in the electrode is connected in series/parallel to the capacitance of the plasma in accordance with the plasma discharge and thus the value changes. The changed capacitance value is measured by the plasma characteristic measuring unit 930 and the controller 925 converts the value into a digitalized value. The plasma characteristic measuring unit 930 measures the plasma characteristic by means of the change in the capacitance, which will be described with reference to Equations 7 to 14 to be described below. Equations 7 to 14 are equations for calculating a density of the plasma using the capacitance variation.

In the exemplary embodiment of the present invention, the plasma characteristic measuring unit 930 may be damaged when amounts of a voltage and a current input through one pair of electrodes of the sensor unit 905 are larger than a predetermined amount. Accordingly, the protection circuit unit 915 is located at a front end of the plasma characteristic measuring unit 930 so as not to damage the signal input through the sensor unit 905. The protection circuit unit 915 limits a high voltage/high current and supplies a regulated voltage.

The above-described electronic device 900 according to the exemplary embodiment of the present invention may be implemented by patterning or contacting in a thin film PCB such as a flexible printed circuit board (F-PCB).

Due to the power input from the outside of the electronic device 900, such as the sensor unit 905, there may be a possibility of causing signal distortion or crosstalk during the process of transmitting the plasma parameter read by the sensor unit 905 to the parameter characteristic measuring unit 930. In order to avoid the possibility, according to the exemplary embodiment of the present invention, the external electric signal is blocked using a metal material connected from a lower end of one pair of electrodes included in the sensor unit 905 to a ground plate between the first planar substrate and the second planar substrate to prevent the signal distortion. Further, an insulator having a low permittivity is used, instead of the metal material, to block the possibility of affecting the external electric signal on the plasma parameter signal, to prevent the distortion of the signal.

When the shielding is performed using the metal, if the metal is exposed to the surface of the first planar substrate, the first planar substrate may be damaged by the arcing between the plasma and the metal so that a metal closer to the surface of the first planar substrate is an insulator having a low permittivity which prevents the metal from protruding from the first planar substrate and blocks the external electric signal.

As one of reasons of selecting this structure, when the measurement is performed using the plasma impedance variation or the capacitance variation, insulators which enclose the planar substrate and the sensor unit are electrically connected to cause an error in the measurement value so that in order to prevent the error, this structure is necessary for electric insulation between the wafer and a patterned electrode molding dielectric. Hereinafter, an implementation example of the sensor unit 905 will be described with reference to FIGS. 10 to 13.

Figure 10:
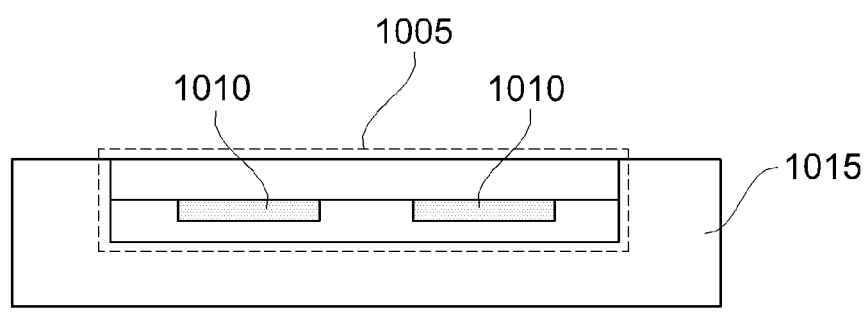
FIGS. 10 and 11 are views that a sensor unit is configured by at least one pair of electrodes according to an exemplary embodiment of the present invention.
Figure 11:
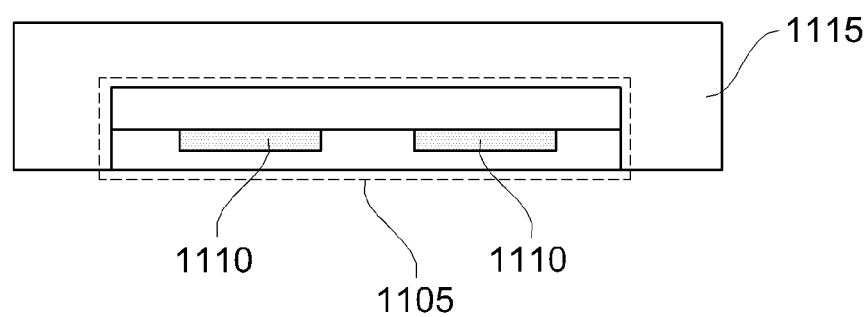

FIGS. 10 and 11 are views that a sensor unit is configured by at least one pair of electrodes according to an exemplary embodiment of the present invention.

FIG. 10 illustrates that a sensor unit 1005 is formed above a first planar substrate 1015 and FIG. 11 illustrates that a sensor unit 1110 is formed below a first planar substrate 1115. The reference numeral 1005 in FIG. 10 and the reference numeral 1105 in FIG. 11 denote an insulator plate which serves to protect the electrodes 1010 and 1110 and the plasma so as not to be in direct contact with each other. The insulator plates 1005 and 1105 need to use an insulating material which has a high breakdown voltage and prevents the leakage current. For example, the insulator plates include ceramic based material to use various dielectrics such as SiN thin film, $SiO_2$ thin film, silicon, and polymer.

In FIGS. 10 and 11, as electrodes 1010 and 1110, two conductive materials are disposed on one dielectric layer to form a coplanar electrode. Generally, a thickness of each electrode is 20 μm to 40 μm. The electrodes 1010 and 1110 use a material having a high conductivity and desirably use a material having a high tolerance to the oxidation.

In FIGS. 10 and 11, the first planar substrates 1015 and 1115 are processed to form a cavity using etching to form electrodes 1010 and 1110 in the cavity.

Even though in FIGS. 10 and 11, it is described that the sensor unit is configured by one pair of electrodes, as illustrated in FIG. 2B, the sensor configured by one or more pairs of electrodes will be described with reference to FIG. 2B and FIG. 12.

Figure 12:
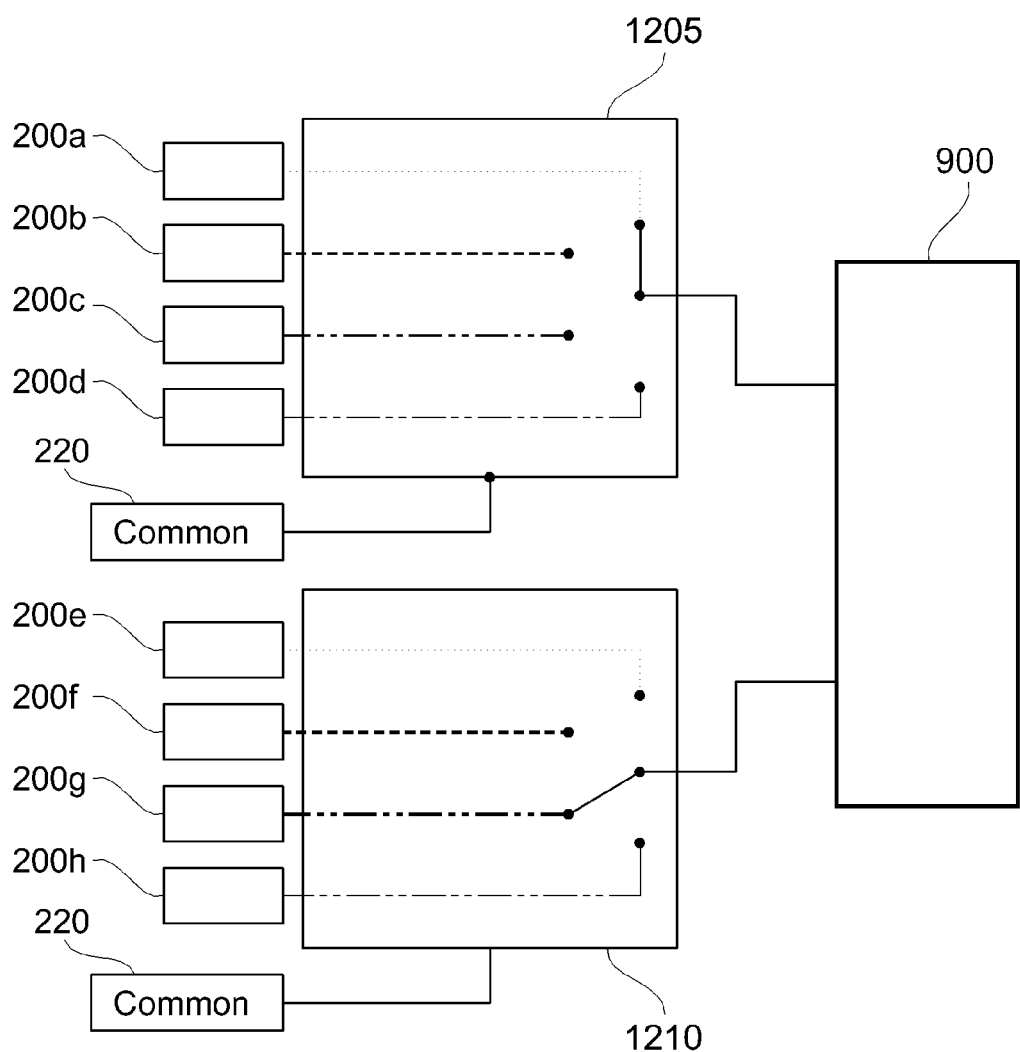
FIG. 12 is a view for explaining a sensor unit and a switching unit configured by one or more pairs of electrodes according to an exemplary embodiment of the present invention.

FIG. 12 is a view for explaining a sensor unit and a switching circuit configured by one or more pairs of electrodes according to an exemplary embodiment of the present invention.

FIG. 12 illustrates that switching circuits 1205 and 1210 are provided to select one pair of electrodes to measure the plasma parameter when the sensor unit is configures by one or more pairs of electrodes 200a, 200b, 200c, 200d, 200e, 200f, 200g, and 200h as illustrated in FIG. 2B. The switching circuits 1205 and 1210 select one pair of electrodes to measure the plasma parameter according to a switching signal from the electronic device 900. For example, the switching circuit 1205 may select electrodes 200a and 220b, or 200a and 200c, or 200a and 200d as electrodes for measuring the plasma parameter. The switching circuits 1205 and 1210 may be implemented by a switch circuit, such as MUX. The reference numeral 220 denotes a common terminal.

As the electrodes 200a, 200b, 200c, 200d, 200e, 200f, 200g, 200h illustrated in FIGS. 2B and 12, one or more pairs of conductive materials are disposed on one dielectric layer to form a coplanar electrode. Generally, a thickness of each electrode according to the exemplary embodiment of the present invention is 20 μm to 40 μm and the electrodes use a material having a high conductivity and desirably use a material having a high tolerance to the oxidation. As described above, according to the exemplary embodiment of the present invention, the electronic device 900 may measure the plasma characteristic using two types of impedance variation and capacitance variation. In order to know the impedance variation and the capacitance variation before/after plasma discharge, a patterned electrode to form a reference signal and measure plasma charged particles is necessary. The patterned electrode is configured by one or more pairs of electrodes and an insulator layer which prevents the electrode damage by the plasma. The electrode is configured by a material having a high conductivity and a strong tolerance to the oxidation and the insulator layer is configured by a material which has the high breakdown voltage and prevents the leakage current. In order to know the impedance variation and the capacitance variation before/after plasma discharge, a patterned electrode to form a reference signal and measure plasma charged particles is necessary. The patterned electrode is configured by one or more pairs of electrodes and an insulator layer which prevents the electrode damage by the plasma.

The electrode is configured by a material having a high conductivity and a strong tolerance to the oxidation and the insulator layer is configured by a material which prevents the high breakdown voltage and the leakage current.

According to the exemplary embodiment of the present invention, the electrode is mainly implemented by two methods.

When the sensor unit 905 is configured by one pair of electrodes, the electrodes are formed on the coplanar surface with the same size. The capacitance and the impedance formed in the electrode vary by parameters, such as a width of the electrode, a size of the electrode, a distance between the electrodes, a type of insulator which molds the electrode, an a thickness of the insulator. Accordingly, it is necessary to select parameters suitable for the purpose.

In contrast, when the sensor unit 905 is configured by one or more pairs of electrodes, the sensor unit 905 may select one pair of electrodes to measure the plasma parameter using switching circuits denoted by reference numerals 1205 and 1210. For example, when four electrodes are used, the plasma parameter may be measured using a total of six pairs of electrodes using the switching circuits 1205 and 1210.

Figure 13:
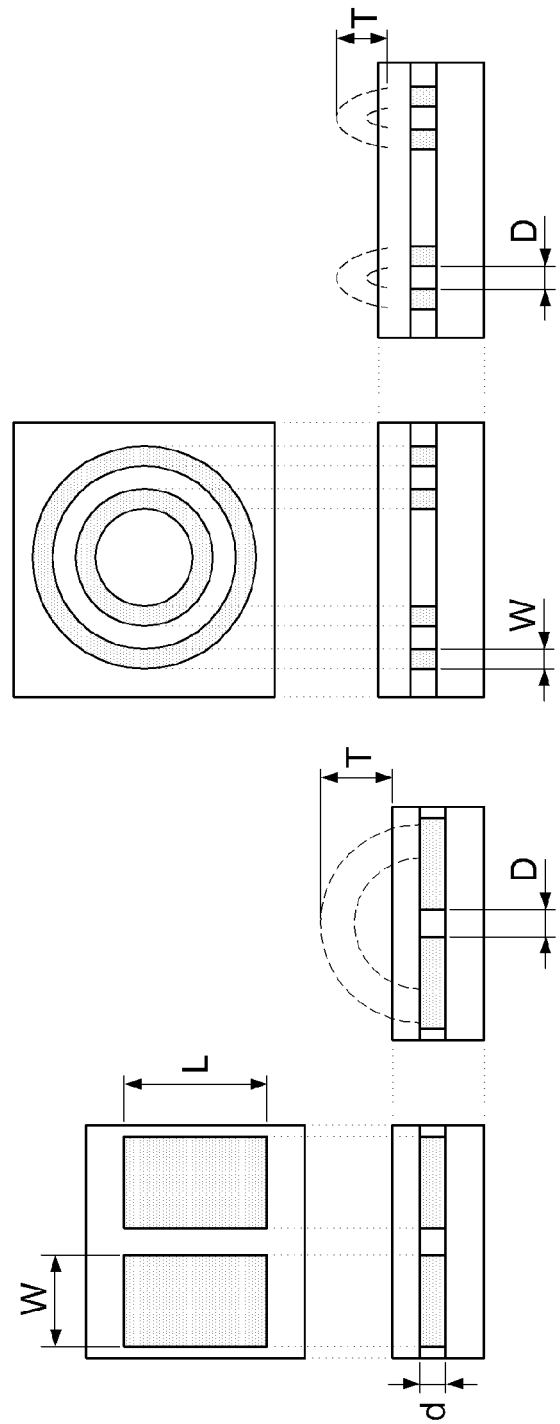
FIG. 13 is a view illustrating an implementation example of a patterned electrode according to an exemplary embodiment of the present invention.

FIG. 13 is a view illustrating an implementation example of a patterned electrode according to an exemplary embodiment of the present invention.

A value of a capacitance formed in the electrode and a signal formation range (penetration depth, T) may vary according to a size and an interval of patterned electrodes and a permittivity of the insulator which molds the electrode.

In the case of the electrode size, in consideration of the end effect, a width W of the electrode is desirably equal to or longer than a length L of the electrode (w≥L) and when signal distortion is caused by the end effect, the electrode is desirably manufactured to be circular. Desirably, the width w of the electrode is set to 1 mm to 5 mm and the length L of the electrode is set to 1 mm to 5 mm.

In the case of the distance d between the electrodes, the signal formation range (penetration depth, T) varies depending on the distance between electrodes and the width of the electrode. Desirably, the distance between electrodes is set to 0.5 mm to 5 mm.

Hereinafter, a principle of diagnosing a plasma density, among plasma characteristics, by the plasma characteristic measuring unit 930 of the electronic device 900 will be described with reference to FIGS. 14 and 15.

Figure 14:
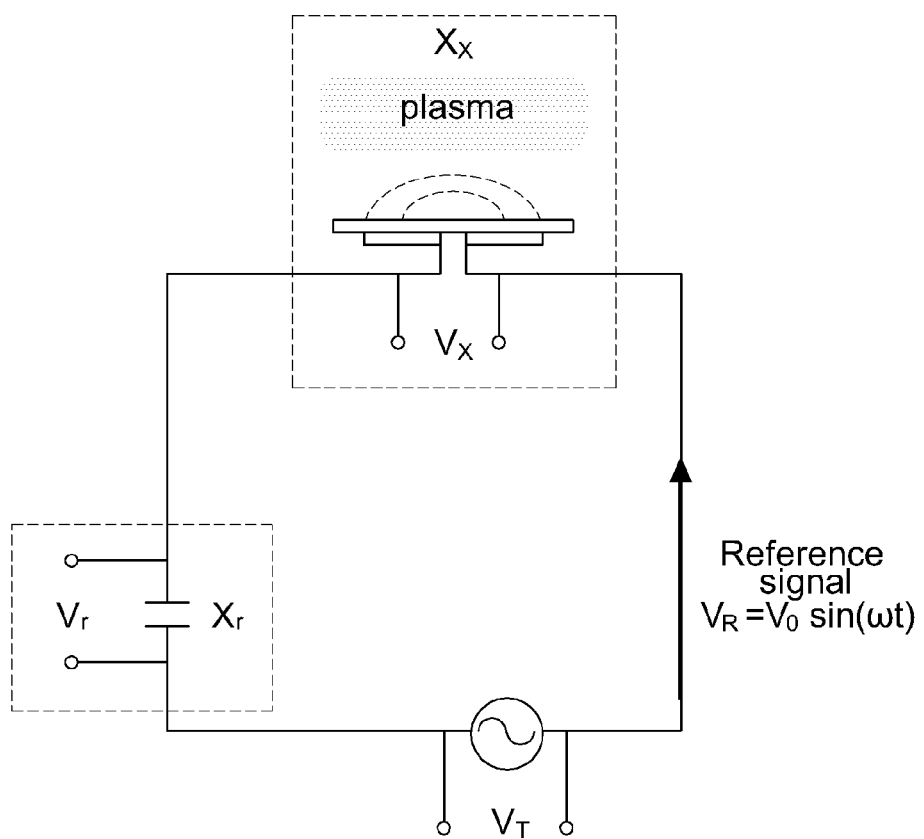
FIG. 14 is a view for explaining a principle of diagnosing a plasma density using an impedance variation according to an exemplary embodiment of the present invention.

FIG. 14 is a view for explaining a principle of diagnosing a plasma density using an impedance change according to an exemplary embodiment of the present invention.

As a basic principle of diagnosing a plasma density using the impedance variation, when an alternating current (AC) voltage having a root mean square (RMS) and having a frequency of 1 kHz to MHz is applied to both electrodes of a plasma sensor which are electrically insulated to apply a potential difference, an impedance according to the patterned electrode type and a thickness of the insulator is generated. At this time, an insulator is placed on a surface on which the impedance is formed and the plasma is discharged. The impedance value of the patterned electrode varies by being connected in series/parallel to an impedance formed in the patterned electrode by plasma parameters (plasma reactance) such as ions, electrons, and radicals discharged from the discharged plasma. This is represented as a voltage variation.

A reference waveform (reference signal $V_R$) is applied into the reference impedance $X_r$ and the patterned electrodes along the circuit. When the impedance value formed in the patterned electrode is $X_x$, a voltage applied to the patterned electrode is $V_x$, a voltage applied to the reference impedance is $V_r$, a voltage applied to the entire circuit is $V_T$, the measurement circuit diagram is illustrated as in FIG. 14.

When a value of the voltage which chances according to the impedance variation by the plasma is defined as Vr' in the plasma characteristic measuring unit 930 of the electronic device 900, an impedance Xx value formed in the patterned electrode is defined by the following Equation 1 by appropriate calculation.

$$X_x = \frac{X_r V_r'}{V_I - V_r'} \qquad \text{[Equation 1]}$$

A total charge $Q_0$ is defined as a sum of a charge $q_p$ of the plasma and an initial charge $Q_i$ as represented in the following Equation 2.

$$Q_0 = (q_p + Q_i) \qquad \text{[Equation 2]}$$

As represented in Equation 2, a charge at an measurement end at which the impedance changes by the reference impedance and the plasma is equal to $Q_0$. Accordingly, the charge Q is calculated by Equations 3 and 4, by means of the correlation between the capacitance C and the voltage V.

$$Q = CV \qquad \text{[Equation 3]}$$

$$Q = Q_0 = (q_p + Q_i) = X_x V_x = X_r V_r = X_T V_I \qquad \text{[Equation 4]}$$

By summarizing Equations 3 and 4, the diagnosis of the plasma density $n_e$ is defined as represented in Equation 5.

$$q_p = n_e e \text{ (e: 전하량)} \quad \text{[Equation 5]}$$

$$\therefore n_e = \frac{q_p}{e}$$

(e: Charge)

Figure 15:
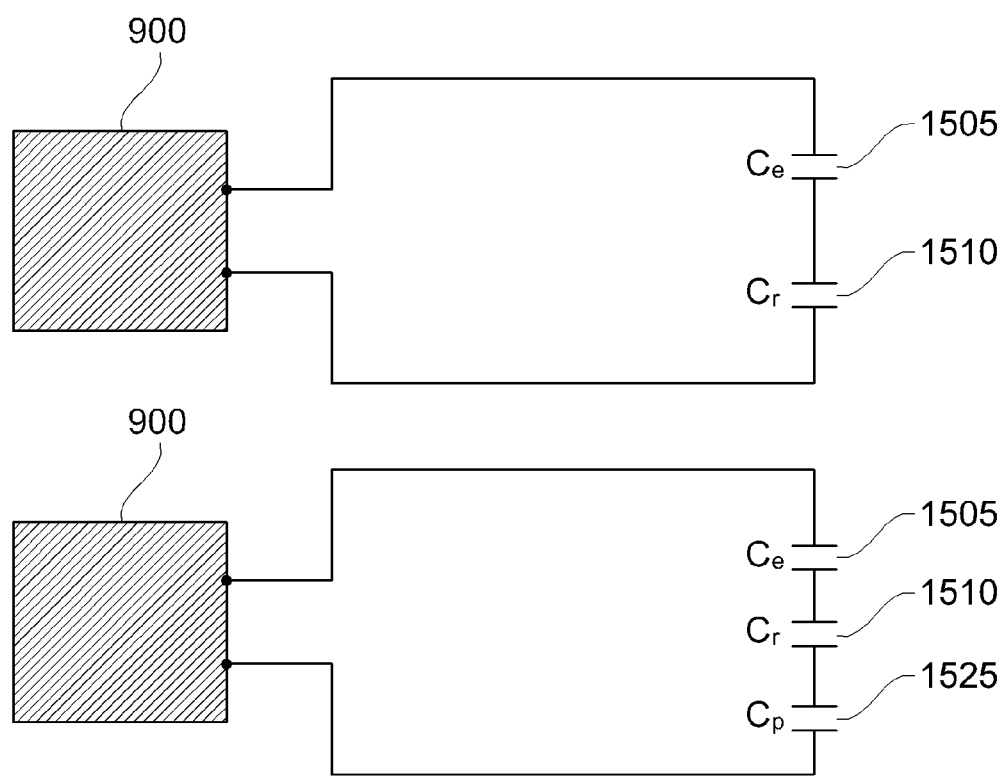
FIG. 15 is a view for explaining a principle of diagnosing a plasma density using a capacitance variation according to an exemplary embodiment of the present invention.

FIG. 15 is a view for explaining a principle of diagnosing a plasma density using the capacitance variation according to another exemplary embodiment of the present invention which is an equivalent circuit of a capacitance variation before/after plasma discharge.

As a basic principle of diagnosing a plasma density using a capacitance variation according to another exemplary embodiment of the present invention, a variance of an initial capacitance according to a patterned electrode design, an insulator type, and a thickness and a capacitance after plasma discharge is measured to diagnose the plasma using the equation.

In the plasma characteristic measuring unit 930 according to another exemplary embodiment of the present invention, the patterned electrode is in contact with the plasma to be connected to the initial capacitance of the electrode in series/parallel so that the capacitance is lowered. Such a capacitance variation is used to measure the plasma characteristic.

In the case of the plasma diagnosis using the impedance variation, the impedance variation is represented as a voltage variance, but in the case of the plasma diagnosis using the capacitance variation, the capacitance variation according to the plasma on/off is directly measured to diagnose the plasma.

An electronic device 900 according to another exemplary embodiment of the present invention illustrated in FIG. 15 converts a capacitance measured by the plasma characteristic measuring unit 930 into a digital signal to output the capacitance as a digitalized value and is floated to prevent the damage due to the high voltage of plasma. Further, the electronic device 900 according to another exemplary embodiment of the present invention measures the capacitance variation before/after the plasma discharge.

In FIG. 15, the reference numeral 1505 denotes a patterned electrode capacitance $C_e$ and represents an initial patterned electrode capacitance and the patterned electrode capacitance varies by parameters such as a width of the electrode, a width of the electrode, an interval between electrodes, a permittivity change according to a type of molding insulator, or a thickness of the insulator. According to another exemplary embodiment of the present invention, the initial patterned electrode capacitance is measured to measure the capacitance variation according to the plasma on/off.

In FIG. 15, the reference numeral 1510 is a total capacitance limit capacitor $C_r$ and is a maximum capacitance which can be measured by the electronic device 900. This is because a measurement range of the capacitance to be measured by the electronic device 900 is determined so that the capacitance beyond the range cannot be measured.

A total capacitance limit capacitor $C_r$ uses a capacitor which is connected in series with a patterned electrode capacitance $C_e$ and a plasma capacitance $C_p$ to adjust a measurement range of the capacitance to be measured as represented in the following Equation 6.

$$C_r >> C_e, C_p \quad \text{[Equation 6]}$$

In FIG. 15, a reference numeral 1525 is a plasma capacitance $C_p$ which is a capacitance of the plasma. The plasma capacitance $C_p$ 1525 is connected in series to the patterned electrode capacitance $C_e$ and a value $C_r$ of the total capacitance limit capacitor during the plasma discharge. The electronic device 900 diagnoses the plasma according to the change in the capacitance according to the plasma on/off.

The capacitance $C_i$ in the circuit before the plasma discharge is calculated by the following Equation 7.

$$C_i = \frac{C_e \times C_r}{C_e + C_r} \quad \text{[Equation 7]}$$

The capacitance $C_T$ in the circuit after plasma discharge, is calculated by the following Equation 8.

$$C_T = \frac{C_i \times C_p}{C_i + C_p} \quad \text{[Equation 8]}$$

The capacitance variation $\Delta C$ in the circuit after plasma discharge is calculated by the following Equation 9.

$$C_i - C_T = \Delta C \quad \text{[Equation 9]}$$

The capacitance variation $\Delta C$ is a capacitance variation by the plasma and the electronic device 900 diagnoses the plasma using the capacitance variation.

A total charge $Q_0$ is calculated by a sum of a charge $q_p$ of the plasma and an initial charge $Q_i$ as represented in the following Equation 10.

$$Q_0 = (q_p + Q_i) \quad \text{[Equation 10]}$$

The charge Q is calculated using the correlation between the capacitance C and the voltage V, as represented in the following Equations 11 and 12.

$$Q = CV \quad \text{[Equation 11]}$$

$$Q = Q_0 = (q_p + Q_i) = \Delta CV \quad \text{[Equation 12]}$$

By summarizing the above equations, the plasma density n e is calculated using the following Equation 13.

$$q_p = n_e e \text{ (e: 전하량)} \quad \text{[Equation 13]}$$

$$\therefore n_e = \frac{q_p}{e}$$

(e: Charge)

Figure 16:
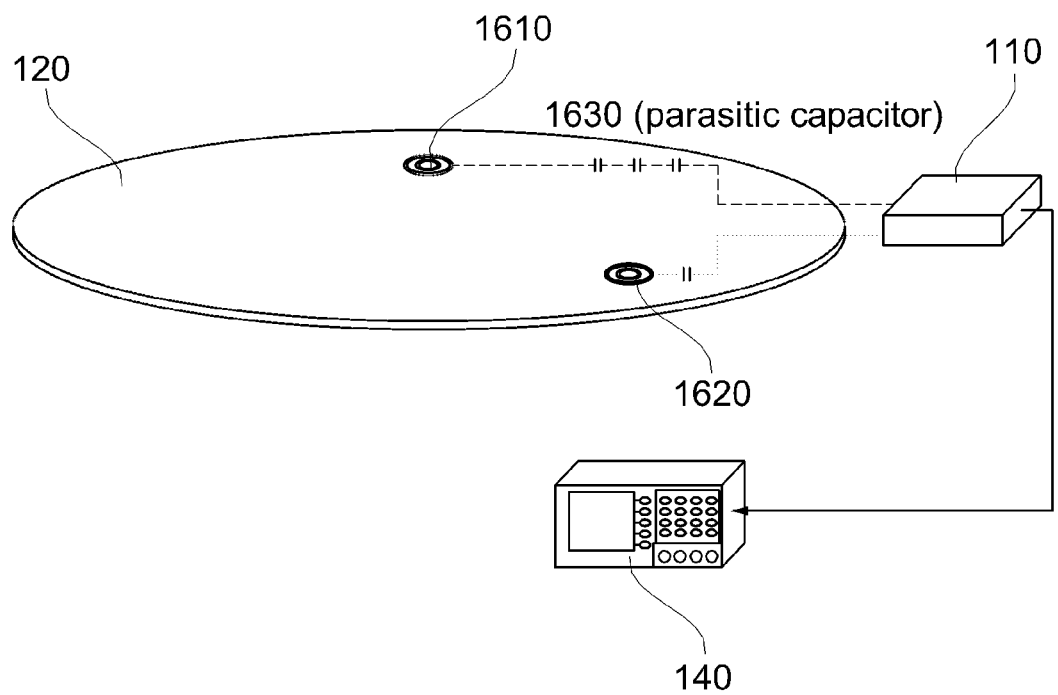
FIG. 16 is a view illustrating that when a patterned electrode is formed on a substrate according to an exemplary embodiment of the present invention, a parasitic capacitance according to a connection length for every position of a patterned electrode is generated.

FIG. 16 is a view illustrating that when a pattern electrode is formed on a substrate according to an exemplary embodiment of the present invention, a parasitic capacitance according to a connection length for every position of a pattern electrode is generated.

As illustrated in FIG. 16, an initial value may vary according to a position of an electrode in a plasma measurement system according to an exemplary embodiment of the present invention. This can be seen as a result of the influence of a parasitic capacitance 1630 by various variables, such as a connection length in the connection between the electrodes 1610 and 1620 and the electronic device 110. It is understood that when the electrode denoted by the reference numeral 1610 is connected to the electronic device 110, there are three capacitances and when the electrode denoted by the reference numeral 1620 is connected to the electronic device 110, there is only one capacitance.

When the plasma is diagnosed using the impedance variation in the exemplary embodiment of the present invention, the initial voltage value for every position varies depending on the position of the electrode and when the plasma is diagnosed using the capacitance variation, the initial capacitance for every position varies depending on the position of the electrode.

In the case of the plasma diagnosis using the impedance variation, the plasma diagnosis is performed by comparing a voltage value before plasma discharge and a voltage after plasma discharge and in the case of the plasma diagnosis using the capacitance variation, the plasma diagnosis is performed by comparing a capacitance before plasma discharge and a capacitance after plasma discharge.

Even though the initial value is different depending on the position, if the variance for every position depending on before/after plasma discharge or presence/absence of the insulator is equal, the initial value is modified using a program.

Figure 17:
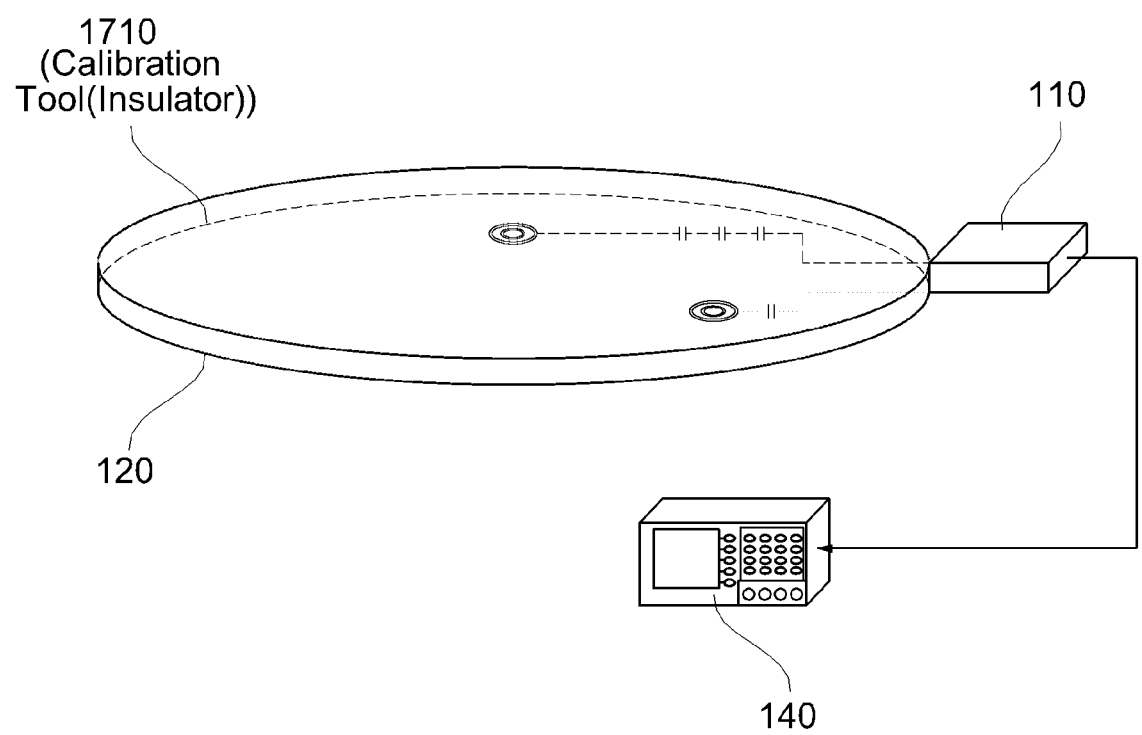
FIG. 17 is a diagram for calibration of an electrode for every position in a plasma diagnosis system according to an exemplary embodiment of the present invention.

As described above with reference to FIG. 16, in order to confirm the same variance is obtained for every position of the electrode, as illustrated in FIG. 17, a calibration tool 1710 is disposed above the plasma diagnosis system according to the exemplary embodiment of the present invention to confirm whether the same change for every position of the electrode appears to perform the calibration.

FIG. 17 is a diagram for calibration of an electrode for every position in a plasma diagnosis system according to an exemplary embodiment of the present invention.

A calibration tool 1710 located on the planar substrate 120 according to an exemplary embodiment of the present invention for calibration uses an insulator and has a size equal to or larger than a size of the planar substrate 120. As described above, a variation value of the impedance/capacitance in the patterned electrode is measured by the calibration tool 1710 to confirm whether the same value changes to perform the calibration.

Figure 18:
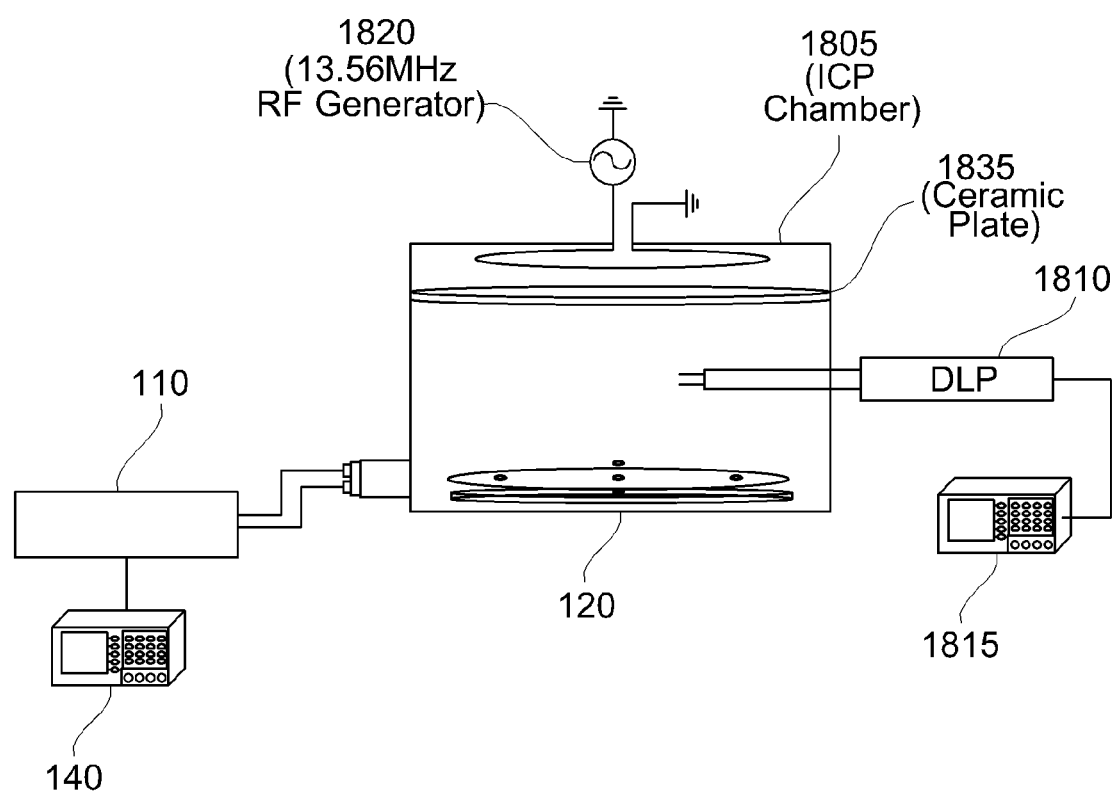
FIG. 18 is an experimental view using a plasma measurement system in a vacuum chamber according to an exemplary embodiment of the present invention.

FIG. 18 is an experimental view using a plasma measurement system in a vacuum chamber according to an exemplary embodiment of the present invention.

A plasma generation device according to the present invention, as illustrated in FIG. 18, includes a sealed inductively coupled plasma (ICP) chamber 1805, a ceramic plate 1835 which forms a magnetic field path in the ICP chamber 1805, an ICP antenna 1825 disposed to be close to an upper surface of the ceramic plate 1835, and a high frequency power supply unit 1820 which supplies a high frequency power to the ICP antenna 1825. The ceramic plate 1836 forms an upper plate of the ICP chamber 1835 to seal the ICP chamber 1835 and forms a path of a magnetic field generated from the ICP antenna 1825. The high frequency power supply unit 1820 may be a high frequency generator which generates a high frequency of 13.56 MHz. The reference numeral 1810 denotes a double Langmuir probe (DLP) and the reference numeral 1815 denotes an observation unit 1815 which measures a plasma density measured by the DLP 1810.

In FIG. 18, the parameter characteristic is measured by means of the substrate 120 in the event of the discharge of the plasma 1830 generated in the ICP chamber and the plasma characteristic is measured using the plasma parameter measured by means of the substrate 120, by means of the electronic device 110 and is output to the user by means of the observation unit 140.

In FIG. 18, the voltage variation and the capacitance variation are measured according to the impedance variation in the event of plasma discharge.

The experiment was performed in the order of 1) measuring a voltage variance according to an impedance variation and calculating a plasma density using measurement data, before/after plasma discharge, 2) measuring a capacitance variation and calculating a plasma density using measurement data, before/after plasma discharge, and 3) comparing a double Langmuir probe (DLP) and a plasma density in the same position and under the same condition.

The experiment condition according to the exemplary embodiment of the present invention is as represented in the following Table 1.

TABLE 1

| Experiment condition | |
| --- | --- |
| Position of patterned electrode | Edge point (lower end of ICP antenna) |
| Discharge gas | Ar gas |
| Discharge flow rate | 50 sccm |
| Discharge power/input frequency | 50 W, 13.56 MHz |
| Number of measurements | 3 times |
| Discharge pressure | 90 mTorr |

Under the above experiment condition, the plasma measurement experiment was conducted using the impedance variation according to the plasma discharge. The plasma density was calculated using Equation by measuring a voltage variation before/after plasma discharge.

Figure 19:
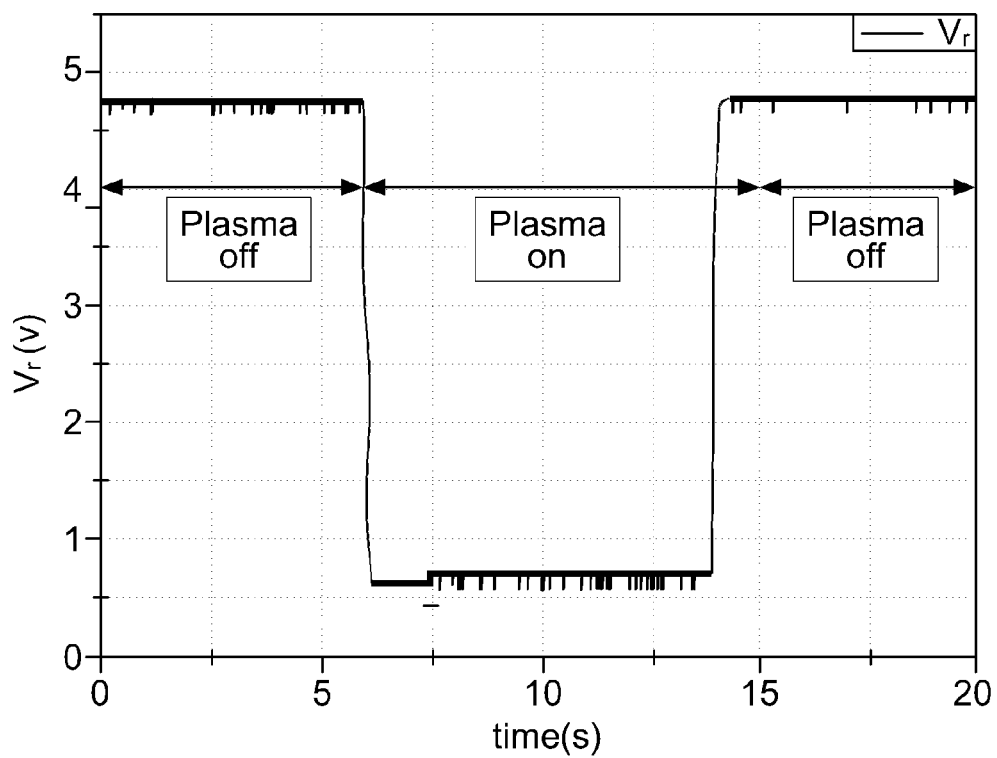
FIG. 19 is a view illustrating an impedance variation before/after plasma discharge according to an exemplary embodiment of the present invention.

FIG. 19 is a view illustrating an impedance variation before/after plasma discharge according to an exemplary embodiment of the present invention and the impedance variation in FIG. 19 represents a change in the voltage.

Figure 20:
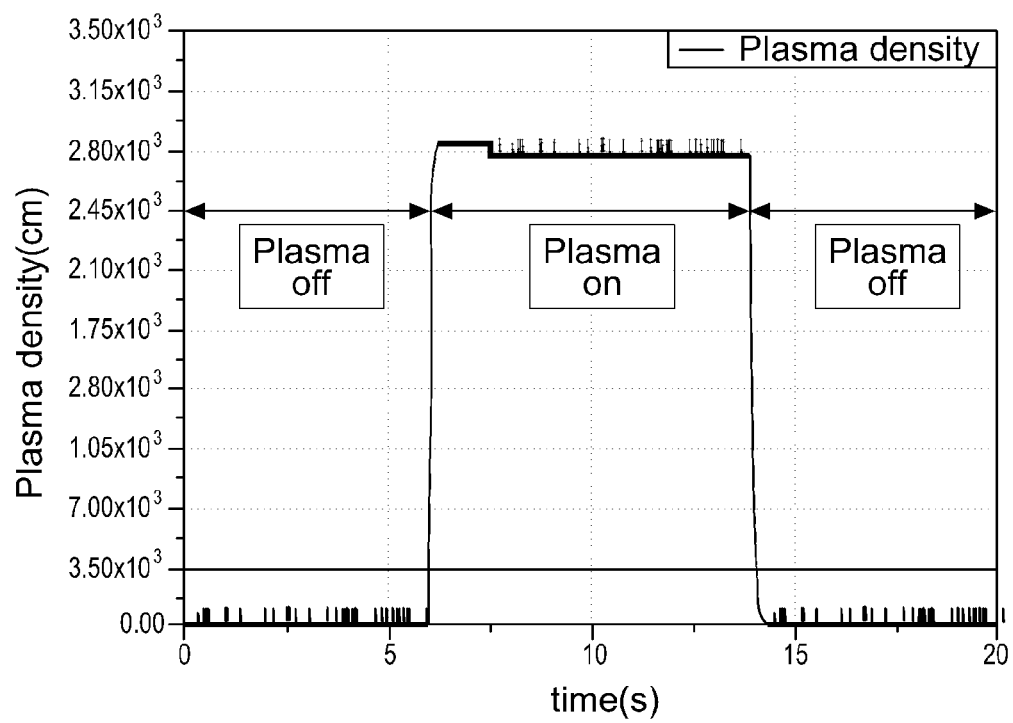
FIG. 20 is a view obtained by measuring a plasma density according to an impedance variation measured in FIG. 19.

FIG. 20 is a view obtained by measuring a plasma density according to an impedance change measured in FIG. 19.

Referring to FIGS. 19 and 20, as a result of using the plasma diagnosis system (using an impedance variation) according to the exemplary embodiment of the present invention, the measured plasma density was measured as $2.78 \times 10^9 [cm^{-3}]$. The plasma density measured using the double Langmuir probe (DLP) which is a probe measurement method, in the same position and under the same condition is as represented in the following Table 2 and FIG. 21.

Figure 21A:
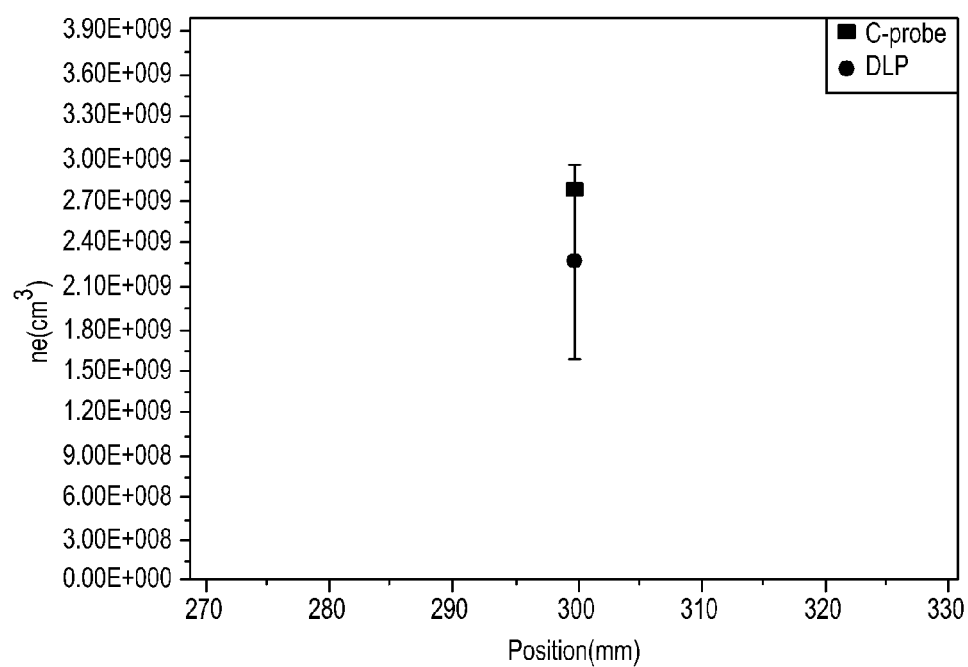
FIGS. 21A and 21B are views obtained by comparing a plasma density measured by an electronic device according to an exemplary embodiment of the present invention and a plasma density measured by a DLP.
Figure 21B:
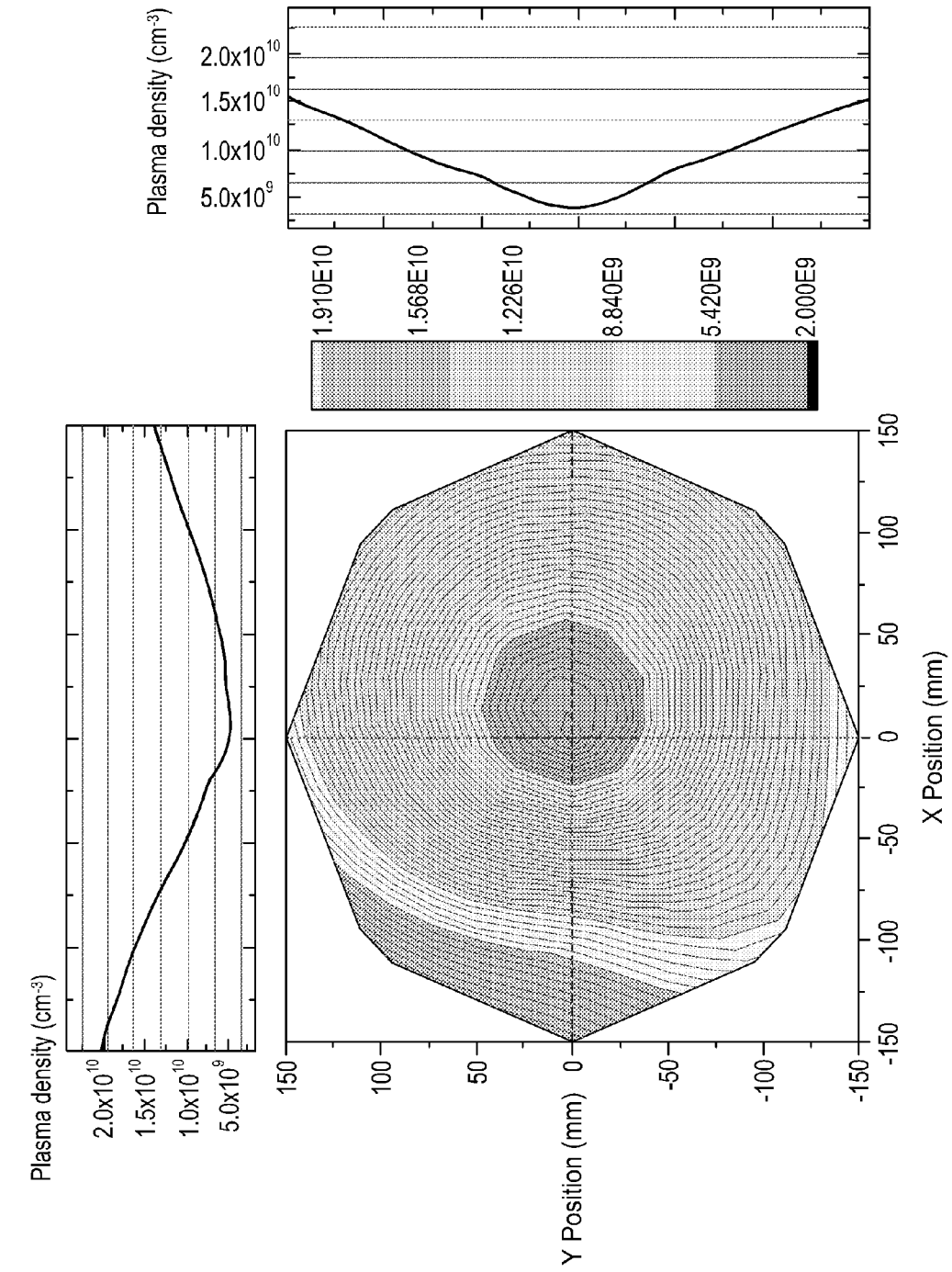

FIGS. 21A and 21B are views obtained by comparing a plasma density measured by an electronic device according to an exemplary embodiment of the present invention and a plasma density measured by a DLP.

FIG. 21A is a view of comparing a plasma density measured by an electronic device 110 according to an exemplary embodiment of the present invention and a plasma density measured by the DLP 1810.

TABLE 2

| Plasma density ($cm^{-3}$) | | Plasma density error | |
| --- | --- | --- | --- |
| C-probe | DLP | DLP error bar | from DLP |
| $2.78 \times 10^9$ | $2.270 \times 10^9$ | ±30% | 18% |

When the plasma density calculated by the plasma diagnosis using the impedance variation and the double Langmuir probe were compared, a plasma density error was measured as 18%.

FIG. 21 illustrates a graph obtained by mapping a calculated value of the plasma density according to a position on an X-Y plane in a chamber.

Figure 22:
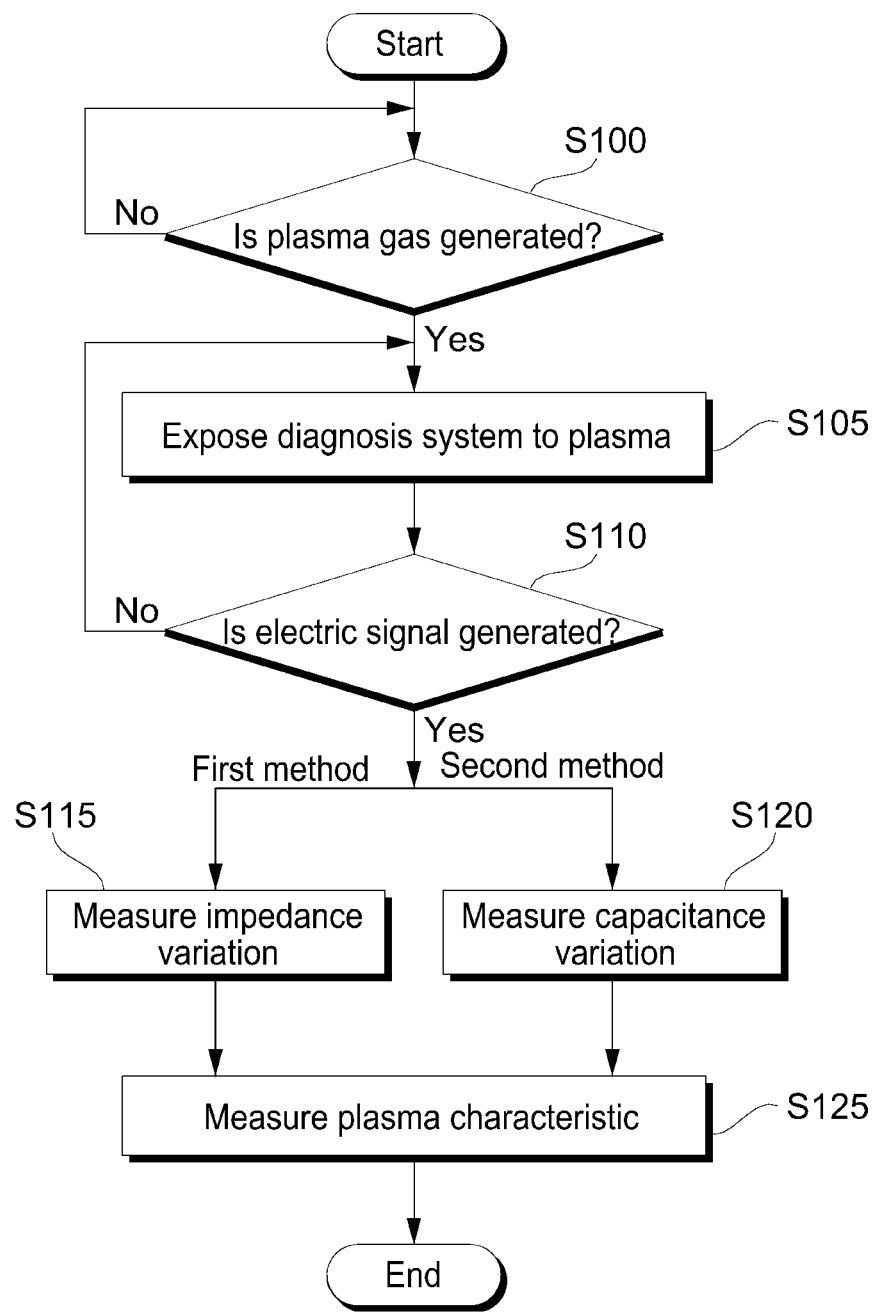
FIG. 22 is a flowchart of a plasma diagnosis method in an electronic device of a plasma diagnosis system according to an exemplary embodiment of the present invention.

FIG. 22 is a flowchart of a plasma diagnosis method in an electronic device 900 of a plasma diagnosis system according to an exemplary embodiment of the present invention.

In step S100, a plasma diagnosis system inspects whether a plasma gas to be diagnosed is generated in a chamber. When the plasma gas is generated in the step S100, the plasma diagnosis system is exposed to the plasma in step S105. Specifically, the substrate 120 of FIG. 3 is exposed to the plasma gas in the chamber 1805.

In step S110, the plasma diagnosis system determine whether an electric signal is generated by a sensor unit which senses the plasma and proceeds to step S115 or step S120 depending on a plasma characteristic measuring method. The first method is a method of measuring an impedance variation before/after plasma discharge and the second method is a method of measuring a capacitance variation before/after plasma discharge.

In step S125, the plasma diagnosis system measures a plasma characteristic using an electric signal generated before/after plasma discharge in the step S115 or the step S120.

The method according to the present invention may be implemented by a computer program stored in a medium to be executed in the computer. Here, the computer readable medium may be an arbitrary available medium accessible by a computer or all the computer storage media. Computer storage media includes all volatile and nonvolatile, removable and non-removable media implemented in any method or technology for storing information, such as computer readable instructions, data structures, program modules or other data and includes a read only memory (ROM), a random access memory (RAM), a compact disc (CD)-ROM, a digital video disc (DVD)-ROM, a magnetic tape, a floppy disc, and an optical data storage device.

The present invention has been described with reference to the exemplary embodiment illustrated in the drawing, but the exemplary embodiment is only illustrative, and it would be appreciated by those skilled in the art that various modifications and equivalent exemplary embodiments may be made.

Accordingly, the true technical scope of the present invention must be determined by the technical spirit of the appended claims.

The invention claimed is:

1. A plasma diagnosis system provided in a plasma chamber to diagnose a state of plasma generated by a plasma generator, comprising:
 a first planar substrate on which at least a part of plasma to be diagnosed, generated in a plasma generation device, is deposited;
 a second planar substrate disposed below the first planar substrate;
 a sensor unit, which is disposed in a cavity formed in the first planar substrate, measures a plasma parameter of the generated plasma, and is enclosed by a first insulator to be electrically insulated from the first planar substrate; and
 an electronic device that measures a characteristic value of the plasma in real time using an electric signal generated by a pair of electrodes in the sensor unit due to the plasma parameter,
 wherein the electronic device includes: a connection unit that receives the electric signal sensed by the sensor unit; and a diagnosis unit, which is located between the first planar substrate and the second planar substrate, is shielded from the first and second planar substrates, respectively, by ground plates, and measures the characteristic value of the plasma using the electric signal,
 wherein second insulators are disposed on both sides of the sensor unit, spaced apart from the sensor unit, and the ground plates extend to the second insulators located on the side surfaces of the sensor unit.

2. The plasma diagnosis system of claim 1, wherein the electric signal is a voltage by an impedance variation measured before/after plasma discharge in the plasma chamber.

3. The plasma diagnosis system of claim 1, wherein the electric signal is a capacitance variation measured before/after plasma discharge in the plasma chamber.

4. The plasma diagnosis system of claim 3, wherein the electronic device includes:
 a protection circuit unit which limits a magnitude of the electric signal when a magnitude of the electric signal received by the connection unit is larger than a predetermined reference;
 wherein the diagnosis unit measures a capacitance of an electric signal transmitted from the protection circuit; and
 a controller which generates a signal representing the plasma characteristic according to the measured capacitance and generates a switching signal to be transmitted to the sensor unit.

5. The plasma diagnosis system of claim 4, wherein the diagnosis unit performs the plasma diagnosis in real time during the plasma process in a vacuum environment.

6. The plasma diagnosis system of claim 5, wherein the diagnosis unit measures a plasma parameter by means of a patterned electrode configured by at least one pair of electrodes provided in the sensor unit and converts the plasma parameter into a plasma density to measure the plasma parameter using at least two methods such as plasma density measurement using a plasma impedance variation and plasma density measurement using a capacitance variation.

7. The plasma diagnosis system of claim 6, wherein the diagnosis unit transmits the measured plasma parameter to the outside of a plasma chamber using a wireless communication module and checks the measured plasma parameter with an external terminal in real time.

8. The plasma diagnosis system of claim 6, wherein the diagnosis unit stores the measured plasma parameter in a memory and after a plasma measuring process, extracts and processes data of the plasma parameter stored in the memory using the external terminal.

9. A plasma diagnosis method of a plasma diagnosis system provided in a plasma chamber to diagnose a state of plasma generated by a plasma generator, comprising:
 generating plasma in a plasma generation device to be diagnosed;
 exposing a plasma diagnosis system to the plasma to diagnose the plasma;
 measuring an electric signal generated from the plasma; and
 measuring a characteristic value of the plasma based on the measured electric signal,
 wherein the plasma diagnosis system includes:
 a first planar substrate on which at least a part of the plasma to be diagnosed, generated in a plasma generation device, is deposited;
 a second planar substrate disposed below the first planar substrate;
 a sensor unit, which is disposed in a cavity formed in the first planar substrate, measures a plasma parameter of the generated plasma, and is enclosed by a first insulator to be electrically insulated from the first planar substrate; and an electronic device that measures a characteristic value of the plasma in real time using an electric signal generated by a pair of electrodes in the sensor unit by the plasma parameter, wherein the electronic device includes: a connection unit that receives the electric signal sensed by the sensor unit; and a diagnosis unit, which is located between the first planar substrate and the second planar substrate, is shielded from the first and second planar substrates, respectively, by ground plates, and measures the characteristic value of the plasma using the electric signal generated by the pair of electrodes in the sensor unit by the plasma parameter, wherein second insulators are disposed on both sides of the sensor unit, spaced apart from the sensor unit, and the ground plates extend to cover the second insulators positioned on the side surfaces of the sensor unit.

10. The plasma diagnosis method of claim 9, wherein the electric signal is a capacitance variation measured before/after plasma discharge in the plasma chamber.

11. The plasma diagnosis method of claim 10, wherein the electronic device includes:

a protection circuit unit which limits a magnitude of the electric signal when a magnitude of the electric signal received by the connection unit is larger than a predetermined reference;

wherein the diagnosis unit measures a capacitance of an electric signal transmitted from the protection circuit; and a controller which generates a signal representing the plasma characteristic according to the measured capacitance and generates a switching signal to be transmitted to the sensor unit.

12. The plasma diagnosis method of claim 11, wherein the diagnosis unit performs the plasma diagnosis in real time during the plasma process in a vacuum environment.

13. The plasma diagnosis method of claim 12, wherein the diagnosis unit measures a plasma parameter by means of a patterned electrode configured by at least one pair of electrodes provided in the sensor unit and converts the plasma parameter into a plasma density to measure the plasma parameter using at least two methods such as plasma density measurement using a plasma impedance variation and plasma density measurement using a capacitance variation.

* * * * *